United States Patent
Schulz-Harder et al.

[19]

[11] Patent Number: 5,987,893
[45] Date of Patent: Nov. 23, 1999

[54] HEAT EXCHANGER ARRANGEMENT AND COOLING SYSTEM WITH AT LEAST ONE SUCH HEAT EXCHANGER ARRANGEMENT

[75] Inventors: Jurgen Schulz-Harder, Lauf; Karl Exel, Rimbach/Odw.; Bernd Medick, Wunsiedel; Veronika Bauer-Schulz-Harder, Lauf, all of Germany

[73] Assignee: Curamik Electronics GmbH, Germany

[21] Appl. No.: 09/123,286

[22] Filed: Jul. 28, 1998

[30] Foreign Application Priority Data

Aug. 2, 1997 [DE] Germany .................... 197 38 455

[51] Int. Cl.$^6$ .................................................. F25B 21/02
[52] U.S. Cl. .................. 62/3.7; 62/3.2; 136/204; 165/80.4; 165/185
[58] Field of Search ............... 62/3.2, 3.7, 259.2; 136/204

[56] References Cited

U.S. PATENT DOCUMENTS

| | | | |
|---|---|---|---|
| 5,228,923 | 7/1993 | Hed | 136/208 |
| 5,269,372 | 12/1993 | Chu | 165/80.4 |
| 5,504,651 | 4/1996 | Atarashi | 361/700 |
| 5,640,852 | 6/1997 | Atlas | 62/3.7 |
| 5,761,037 | 6/1998 | Anderson | 361/700 |
| 5,761,909 | 6/1998 | Hughes | 62/3.2 |

*Primary Examiner*—Henry Bennett
*Assistant Examiner*—Melvin Jones
*Attorney, Agent, or Firm*—Hoffman, Wasson & Gitler

[57] ABSTRACT

A microcooler with channels through which coolant flows. The channels are formed by individual cooler layers having a region which is structured in the manner of a screen and having a plurality of openings with edge lines closed and with material bridges or material regions remaining between these openings. None of the openings on any of the cooler layers form a continuous channel which extends from a collection space for feed of the coolant to a collection space for drainage of the coolant. The individual breaches, and the material bridges or material regions, provided between them are offset from cooler layer to cooler layer such that flow of the coolant through the cooler is possible only with continuous changing of the layers. Using the breaches within the cooler results in a highly branched labyrinth through which coolant flows. The size of the breaches and the width of the material sections and material bridges are matched to one another such that flow through is possible with continuous changing of the layers. This microcooler has the advantage that very intensive flow around the bridges and material regions formed by the individual layers takes place by the heat-transporting medium so that intensive heat transfer is achieved between this medium and the layers of the microcooler.

46 Claims, 24 Drawing Sheets

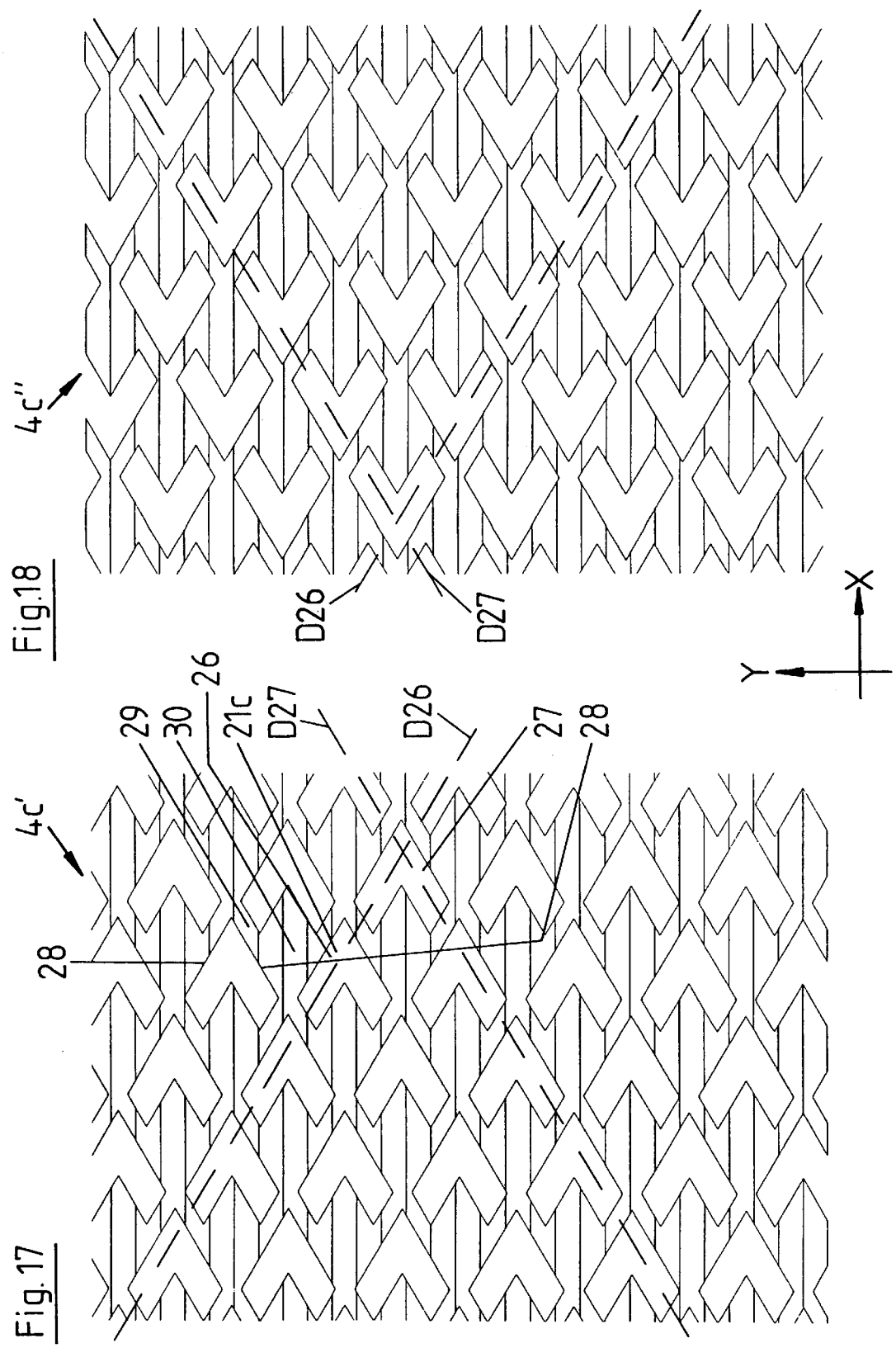

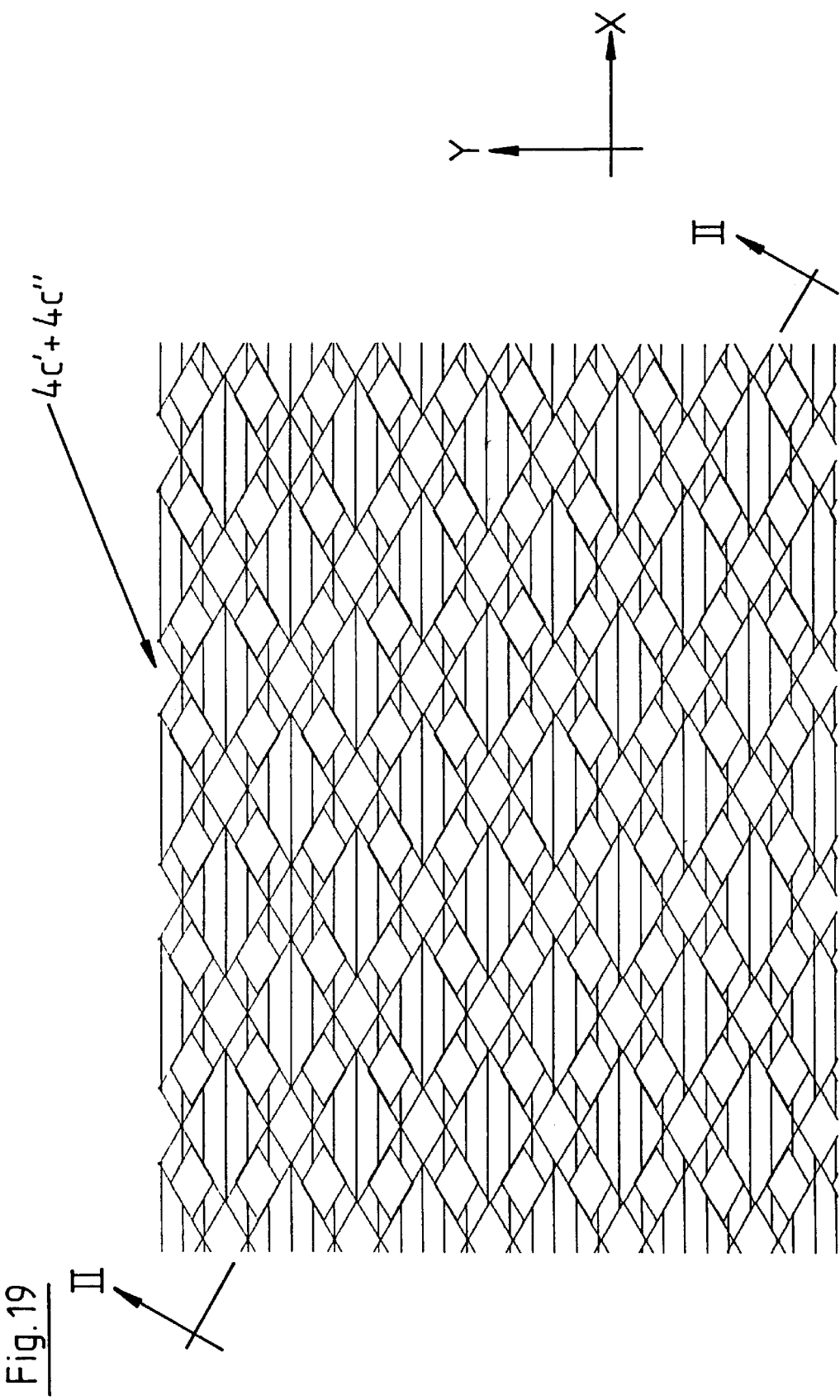

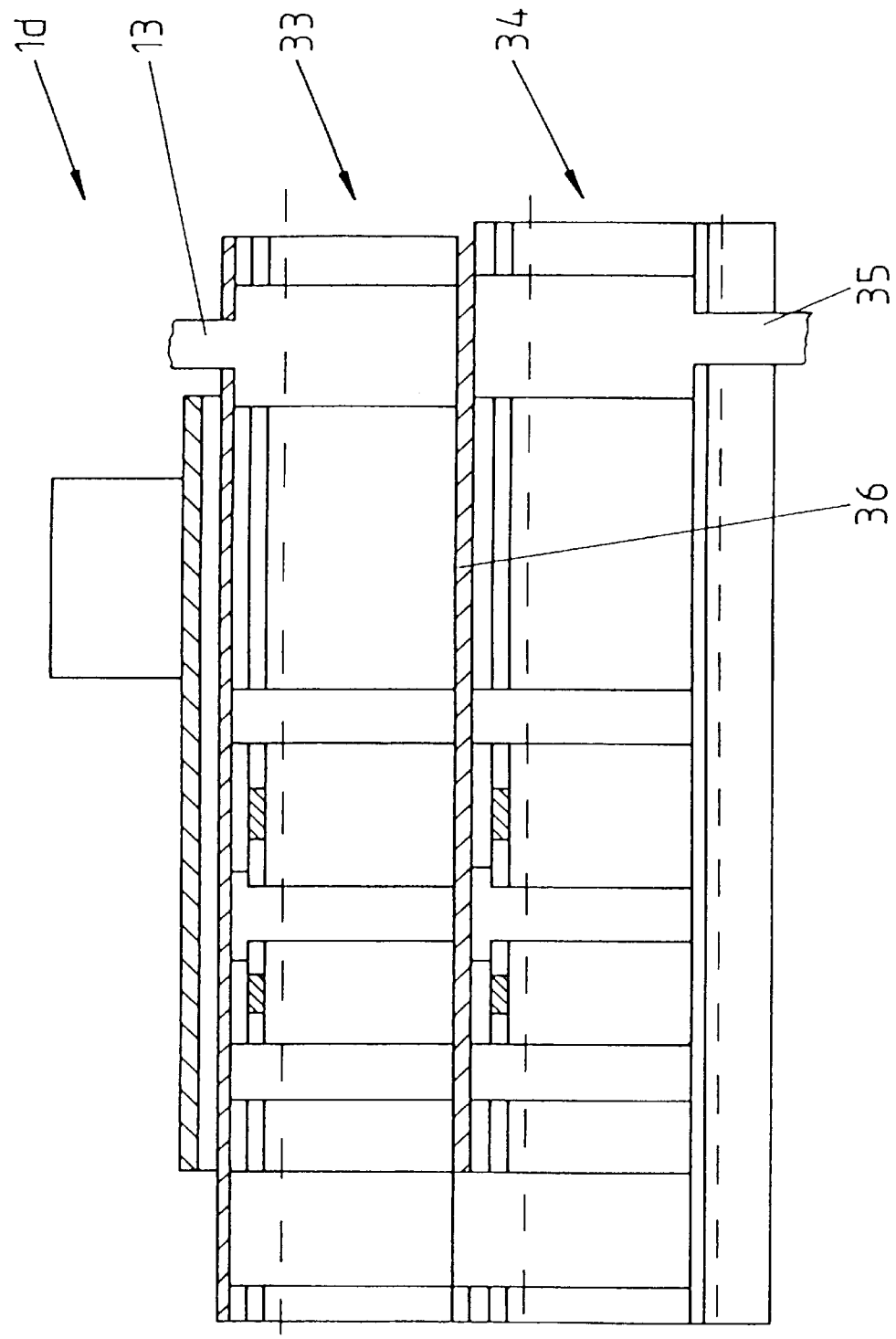

5,987,893

HEAT EXCHANGER ARRANGEMENT AND COOLING SYSTEM WITH AT LEAST ONE SUCH HEAT EXCHANGER ARRANGEMENT

BACKGROUND OF THE INVENTION

The invention relates to a heat exchanger arrangement and to a cooling system.

Coolers and heat exchangers used as heat sinks for electrical components are known, especially those which are formed by several layers stacked on top of one another. Joining the individual layers to one another using so-called DCB (direct copper bond) technology is also known here.

The object of the invention is to devise a heat exchanger arrangement which is suitable for cooling, heating, and which has improved efficiency.

A "cooler" or "microcooler" for the purposes of the invention generally means a "heat exchanger" which is used for heating or cooling and through which a heat-transporting medium flows, preferably a liquid medium (for example, water).

SUMMARY OF THE INVENTION

In the invention, a microcooler is used in which the channels through which the coolant flows within the microcooler are formed by the individual cooler layers having a region which is structured in the manner of a screen and having a plurality of openings with edge lines closed and with material bridges or material regions remaining between these openings. None of the openings on any of the cooler layers form a continuous channel which extends from a collection space for feed of the coolant to a collection space for drainage of the coolant. The individual breaches, and the material bridges or material regions, provided between them are offset from cooler layer to cooler layer such that flow of the coolant through the cooler is possible only with continuous changing of the layers and using the breaches, therefore within the cooler a highly branched labyrinth results through which coolant flows, in which in the flow paths formed by the breaches there are material sections opposite the breaches. The size of the breaches and the width of the material sections and material bridges are matched to one another such that flow through is possible with continuous changing of the layers. This microcooler has the advantage that very intensive flow around the bridges and material regions formed by the individual layers takes place by the heat-transporting medium so that intensive heat transfer is achieved between this medium and the layers of the microcooler. In this microcooler, the individual layers are structured such that these continuous posts which extend perpendicular to the planes of the layers form and consist of the metal of the layers, so that via these posts uniform heat distribution takes place over the entire height or the total cross section of the respective microcooler.

BRIEF DESCRIPTION OF THE DRAWINGS

The invention is detailed below using the following figures:

FIG. 17 shows an enlarged detailed view of FIG. 14;

FIG. 18 shows an enlarged detailed view of FIG. 16;

FIG. 19 shows an enlarged detail view of FIG. 16;

FIG. 21 shows in a view similar to FIG. 1 another possible embodiment of the cooler in which two individual coolers are cascaded in succession;

DETAILED DESCRIPTION OF THE INVENTION

Figure 1:
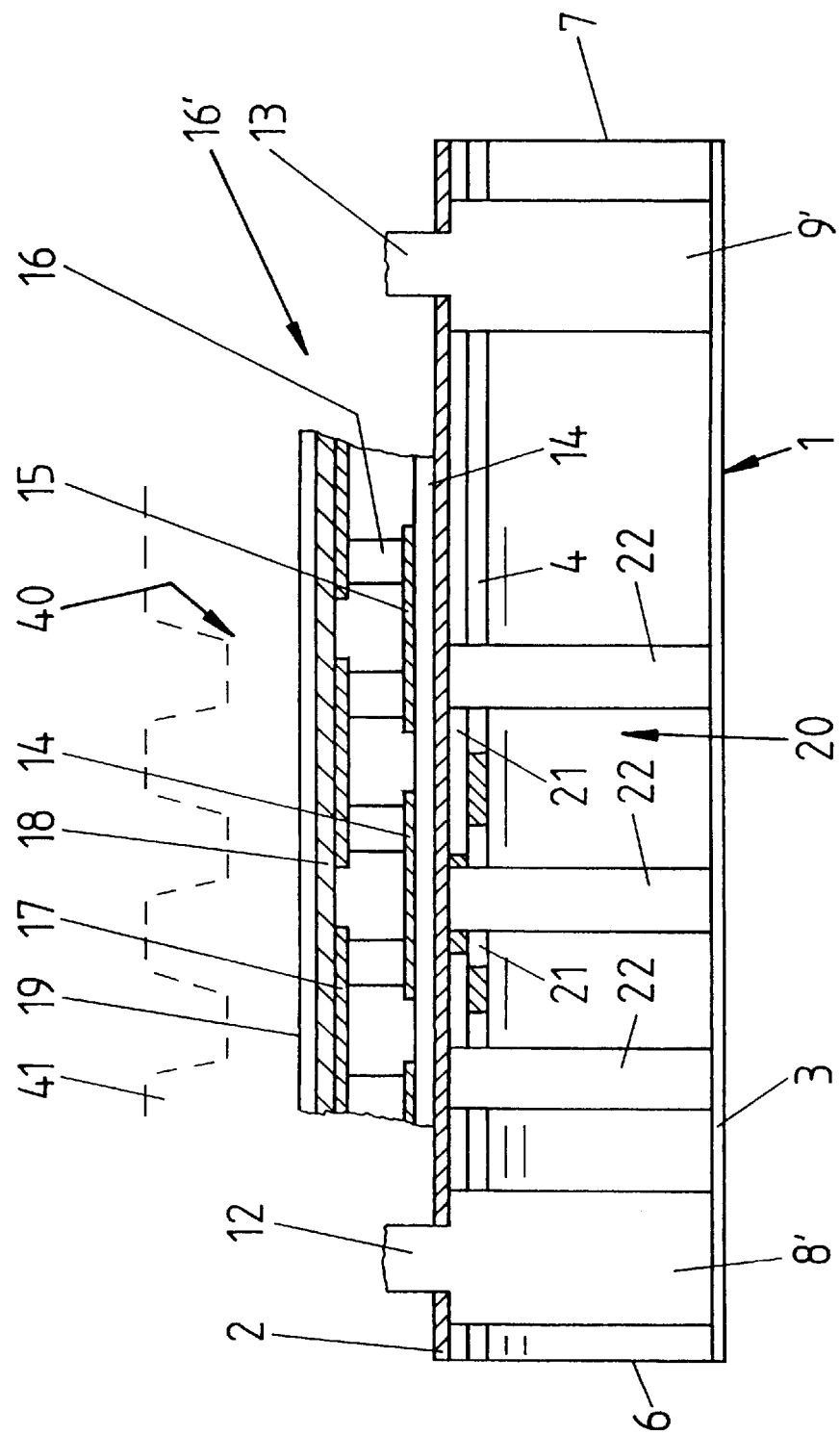
FIG. 1 shows in a simplified view and in cross section the heat exchanger arrangement of the invention with a microcooler produced from a plurality of layers which are stacked on top of one another and which are formed by one metal foil at a time (also heat exchanger element) with a Peltier element structure or configuration.

FIG. 1 shows in a simplified view and in cross section heat exchanger 40 with microcooler 1. The latter contains a plurality of thin layers stacked on top of one another and joined to one another, specifically of top and bottom terminal layer 2 and 3 and of a plurality of cooler layers located between them, which are labeled 4 in general in FIG. 1, but which in fact have the different layout detailed below. Cuboidal microcooler 1 in an overhead view has a square peripheral surface.

In the embodiment shown, layers 2–4 are made of thin plates or foils of metal, for example copper, which are joined flat to one another to microcooler 1, for example, by using DCB technology. Other methods are also available for joining individual layers 2–4 flat to one another to the microcooler, for example, by diffusion bonding in which layers 2–4 are welded to their boundary layers under high pressure and under the action of heat.

Cooler layers 4 are generally structured such that, in the area of two opposing sides 6 and 7, they have one opening 8 and 9 which are closed to sides 6 and 7 and peripheral sides 10 and 11 of respective layer 4 which follow at a right angle, and for example, in the embodiments shown in the Figures, are made as an equilateral, obtuse triangle (as a triangle with an angel much greater than 90 degrees between the two identical sides). Individual cooler layers 4 are arranged congruently with their openings 8 and 9 so that opening 8 forms collection space 8' for supplying a coolant and opening 9 forms collection space 9' for draining the coolant. On top terminal layer 3 for collection spaces 8' and 9' there are connections 12 and 13, of which connection 12 can be connected to a coolant feed and connection 13 to a coolant return.

In cooler or heat exchanger arrangement 40 of FIG. 1 on the top of terminal layer 2 of microcooler 1 facing away from cooler layers 4, ceramic layer 14 is attached on which there is structured metal layer 15. The latter is formed by a metal foil which was structured using conventional techniques to obtain the layout of a Peltier substrate detailed below. The metal foil which forms metal coating 15 is, for example, a copper foil. Ceramic layer 14 and metal coating 15 are joined to microcooler 1 or top terminal layer 2 by using DCB technology.

Peltier elements are labelled 16 and for their electrical connection to one of their contact surfaces at a time they are joined to structured metal coating 15 and to their other contact surface which is the top one in FIG. 1 and which is away from the microcooler with structured metal coating 17 which is provided on bottom of ceramic layer 18 facing microcooler 1, which (bottom) is connected on its side facing away from the Peltier elements 16 to metal coating 19. On metal coating 19 which is likewise preferably structured there is, for example, a power component to be cooled.

Metal coatings 15 and 17 are structured and the Peltier elements are arranged such that all Peltier elements lie in series in a circuit which includes structured metal coatings 15 and 17 and the printed conductors formed by them, such that each Peltier element 16 is turned 180 degrees opposite the element which is adjacent in the series connection, i.e. for example, the cooling side of all Peltier elements is on metal coating 17 and the heat-dissipating side is on metal coating 15. Peltier elements 16 make it possible to effectively dissipate heat from metal coating 19 or from the component located there which is to be cooled and to transfer it to microcooler 1 from which this lost heat is dissipated by the heat-transporting medium.

Controlling and/or regulating the Peltier current makes it possible to control the cooling action, for a constant flow of the coolant through microcooler 1 to obtain a temperature as constant as possible on metal coating 19. This is important when the component to be cooled is a diode laser in which the wavelength of the laser light depends on the operating temperature of the laser chip.

The connection between metal coatings 17 and 19 and ceramic layer 18 takes place by means of DCB technology. Ceramic layers 14 and 18 are, for example, made of aluminum oxide. If an especially high cooling action is necessary, at least one of the two ceramic layers, for example ceramic layer 18, can be made of aluminum nitride (AlN).

Ceramic layers 14 and 18, structured metal coatings 15 and 17 and Peltier elements 16 from Peltier element arrangement 16'.

The cooling arrangement embodying the invention contains a so-called microcooler. The structure of this cooler is detailed in different versions (as possible embodiments).

In microcooler 1, of FIG. 1, on the top of terminal layer 2, facing away from cooler layers 4, ceramic layer 14 is attached on which there is another structured metal layer 15.

The latter, for example, is formed by a metal foil which was structured using conventional techniques to obtain the desired layout for electrical printed circuits, contact surfaces, etc. The metal foil, which forms metal coating 15, is, for example, a copper foil. Ceramic layer 14 and the metal layer which forms metal coating 15 are joined to one another and to microcooler 1 using DCB technology.

Electrical components are labelled 16 and are attached in a suitable manner on metal coating 15 or on the contact surfaces formed by it. For components 16 with extremely high power, there is also the possibility of attaching them directly to upper terminal layer 2 if respective component 16 allows.

Ceramic layer 14 is, for example, made of an aluminum oxide ceramic. It is also possible for ceramic layer 14, to contain at least in partial areas, an aluminum oxide ceramic, especially when a thermal resistance as small as possible is necessary to achieve a cooling action as large as possible.

The bottom of cooling body 1 formed on bottom terminal layer 3 in FIG. 1 is connected to metal support element 17. This support element 17 is a plate, but can also be made with channels which are indicated by broken lines 18 in FIG. 1 and which are used to supply and drain coolant and are connected each to collection space 8' and 9'. Connections 12 and 13 are then omitted or closed. Using channels 18, a lateral connection of cooler 1 to the coolant supply or coolant return is possible. If support 17 has channels 18, this support is formed from a plurality of interconnected layers, for example, made of metal, each layer having at least two slotted recesses and the same recesses of each layer being arranged congruently with one another so that channels 18 to supply or drain the coolant are formed.

In FIG. 1, the insulating layer or a ceramic layer on bottom terminal layer 3 is labelled 19. This additional ceramic layer 19 which is formed, for example, by an aluminum oxide ceramic is used when an insulated attachment of cooler 1 on a plate which forms support 17 is necessary. Ceramic layer 19 is in turn connected using DCB technology to microcooler 1 and/or to support element 17. It is furthermore possible to make top and/or bottom terminal layer 2 and 3 each a ceramic layer, and when such is accomplished, ceramic layers 14 and 19, can be omitted.

It is common to all embodiments detailed below, that cooler layers 4, between two openings 8 and 9, have an area which is structured in the manner of a screen with a plurality of breaches 21 and which is generally labelled 20, in FIG. 1. This area 20, and openings 8 and 9, of each cooler layer 4, which are located on either side of this area, are located within a closed edge area of this cooler layer. Areas 20 are made with breaches and with net-like areas or bridges of material remaining between them such that cooler layers 4, which adjoin one another in the manner of a stack with certain partial areas of the material bridges or sections form continuous columns 22; these partial areas are joined to one another and abut one another again and again from cooler layer to cooler layer, i.e. continuously. Columns 22, with their longitudinal extension, are perpendicular to the planes of layers 2–4 and extend from top terminal layer 2 to bottom terminal layer 3. Each breach 21 in one cooler layer 4 in the viewing direction perpendicular to the planes of layers 2–4 overlaps at least one breach 21 of an adjacent cooler layer, only partially, so that each breach 21 of cooler layer 4 is also opposite at least one other partial areas of at least one material bridge or one material section of an adjacent cooler layer. In this way, flow paths which continuously alternate layers and which are repeatedly angled between columns 22 are formed for the coolant which then can travel from collection space 8' to collection space 9' only has the planes continually alternate, at least with continuous alternation of the planes of two adjacent cooler layers, and in doing so intensive flow takes place around not only columns 22, but also the material bridges or material sections of cooler layers 4 laterally from these columns, with an intensive cooling action or high efficiency being achieved.

It was assumed above that in microcooler 1 cooler layers 4 adjoin one another with the indicated structure. It is also possible that each cooler layer 4, or individual cooler layers 4, is formed by several years.

FIGS. 2–8 in detail explain one possible embodiment of cooler layers 4 of cooler 1a. These cooler layers are labelled 4a' and 4a'' in FIGS. 2–8, in the stack forming microcooler 1a one cooler layer 4a'' at a time being directly adjacent to cooler layer 4a' and vice versa. As is detailed below, cooler layers 4a' and 4a'' with respect to structured area 20a' and 20a'' are made such that turning or rotation of cooler layer 4a' around middle axis M which runs in the middle between two peripheral sides 6 and 7 and parallel to these peripheral sides yields cooler layer 4a''.

Figure 2:
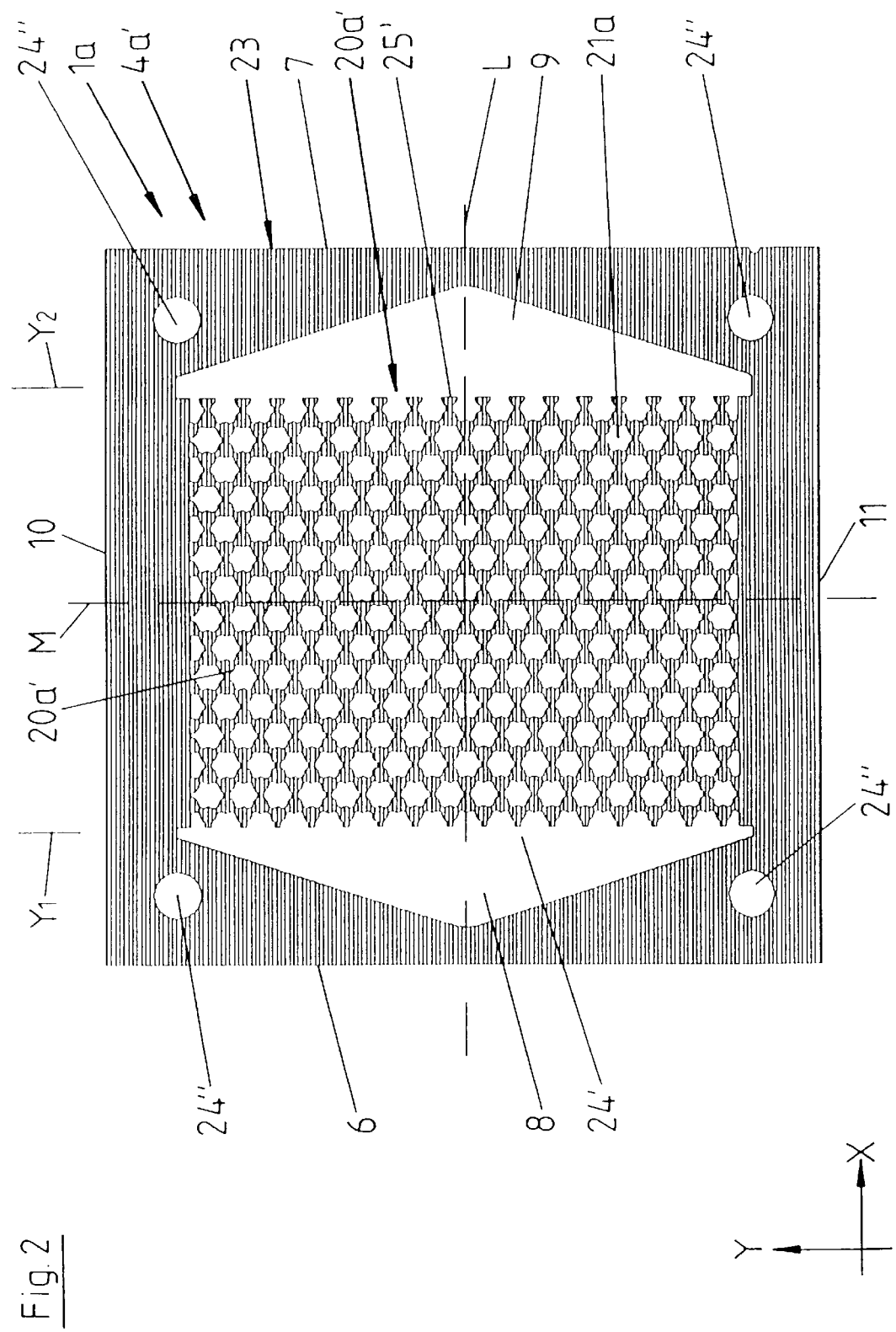
FIGS. 2 and 3 show each in an individual view and in an overhead view two cooler layers N1 and N2 stacked on top of one another in a first possible embodiment.
Figure 3:
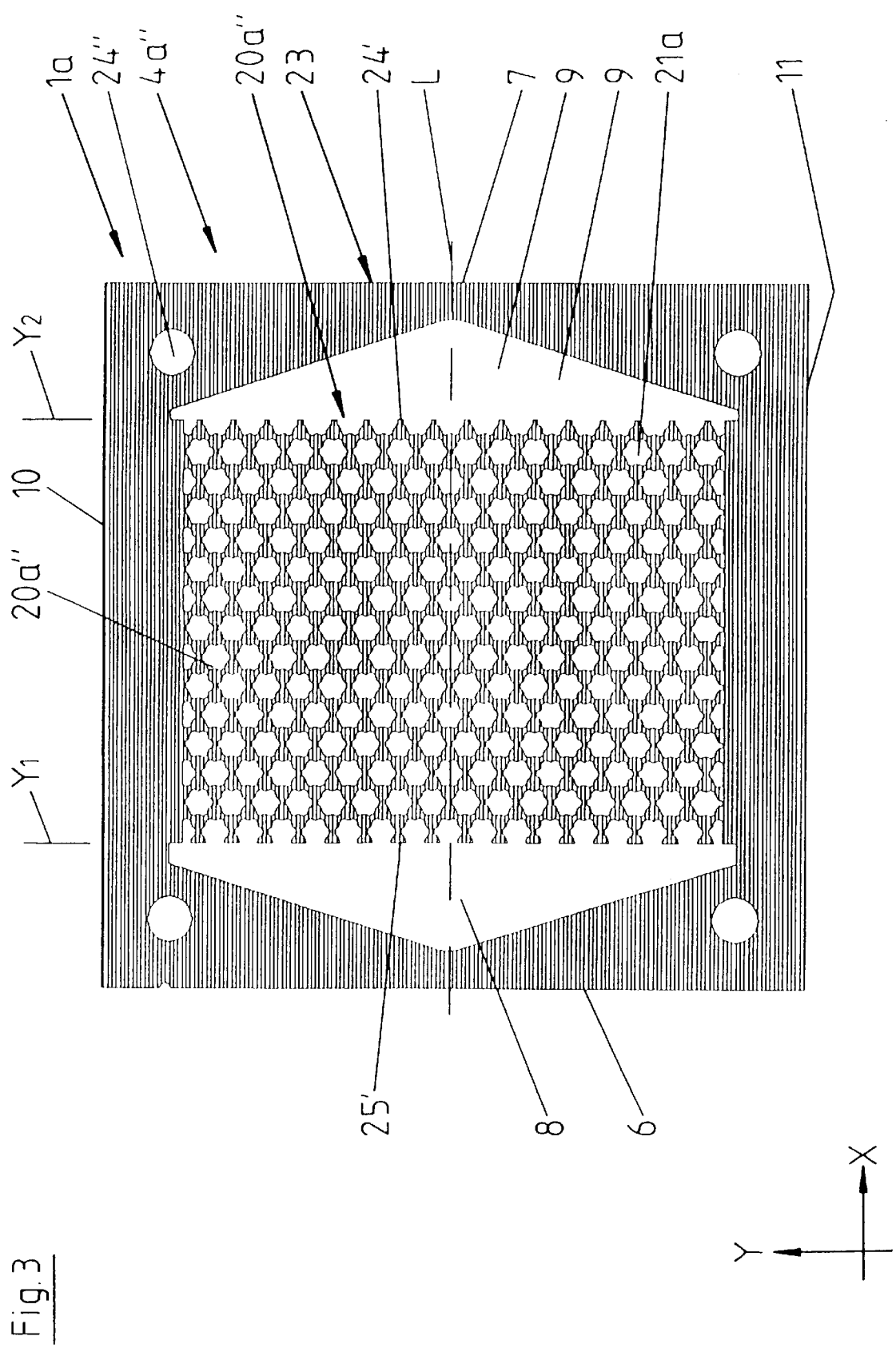
Figure 4:
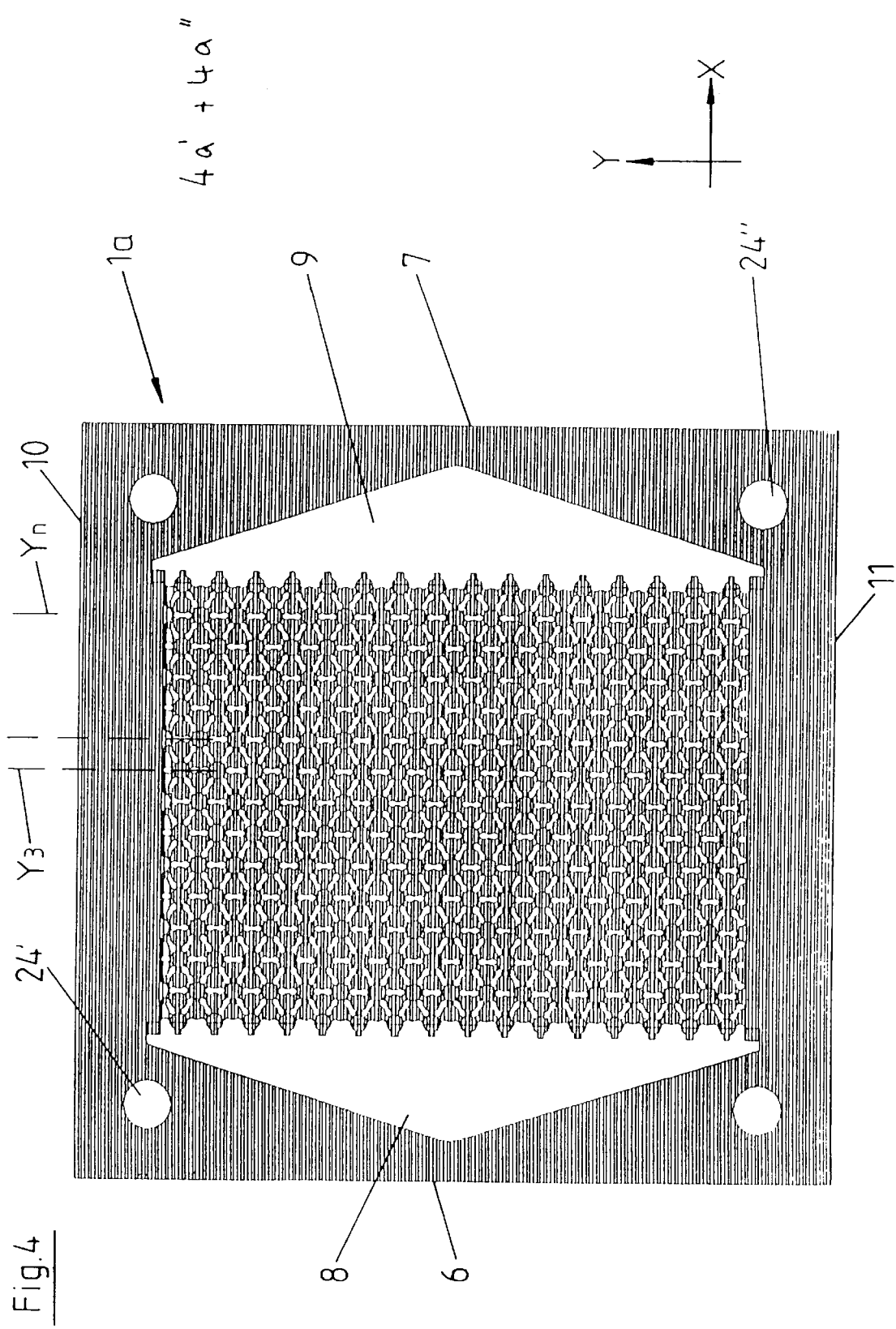
FIG. 4 shows an overhead view of the two layers of FIG. 2 located on top of one another in a microcooler.
Figure 5:
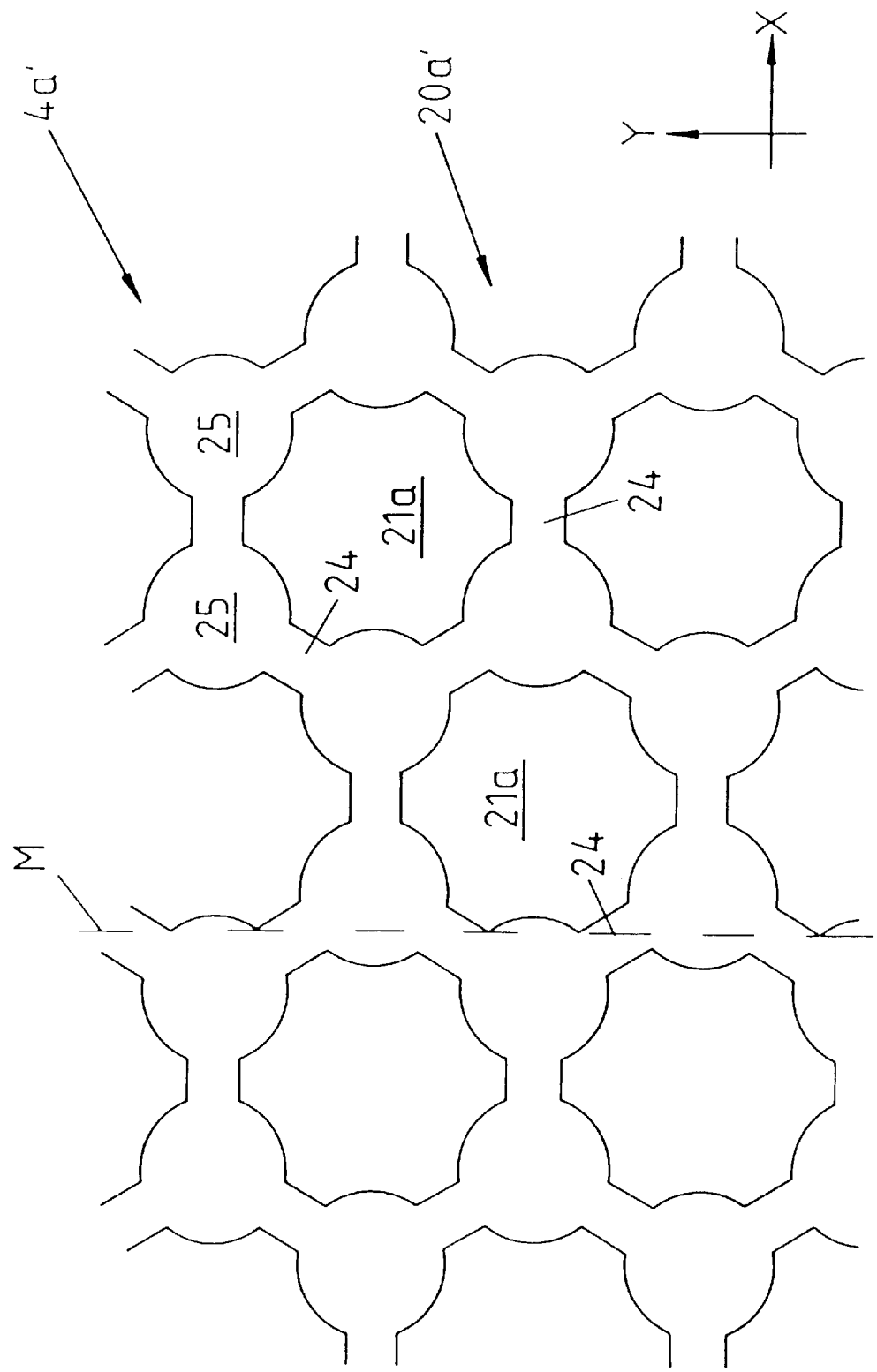
FIGS. 5 and 6 in an enlarged partial view show the cooler layers of FIGS. 2 and 3 each in the area of middle axis M.
Figure 6:
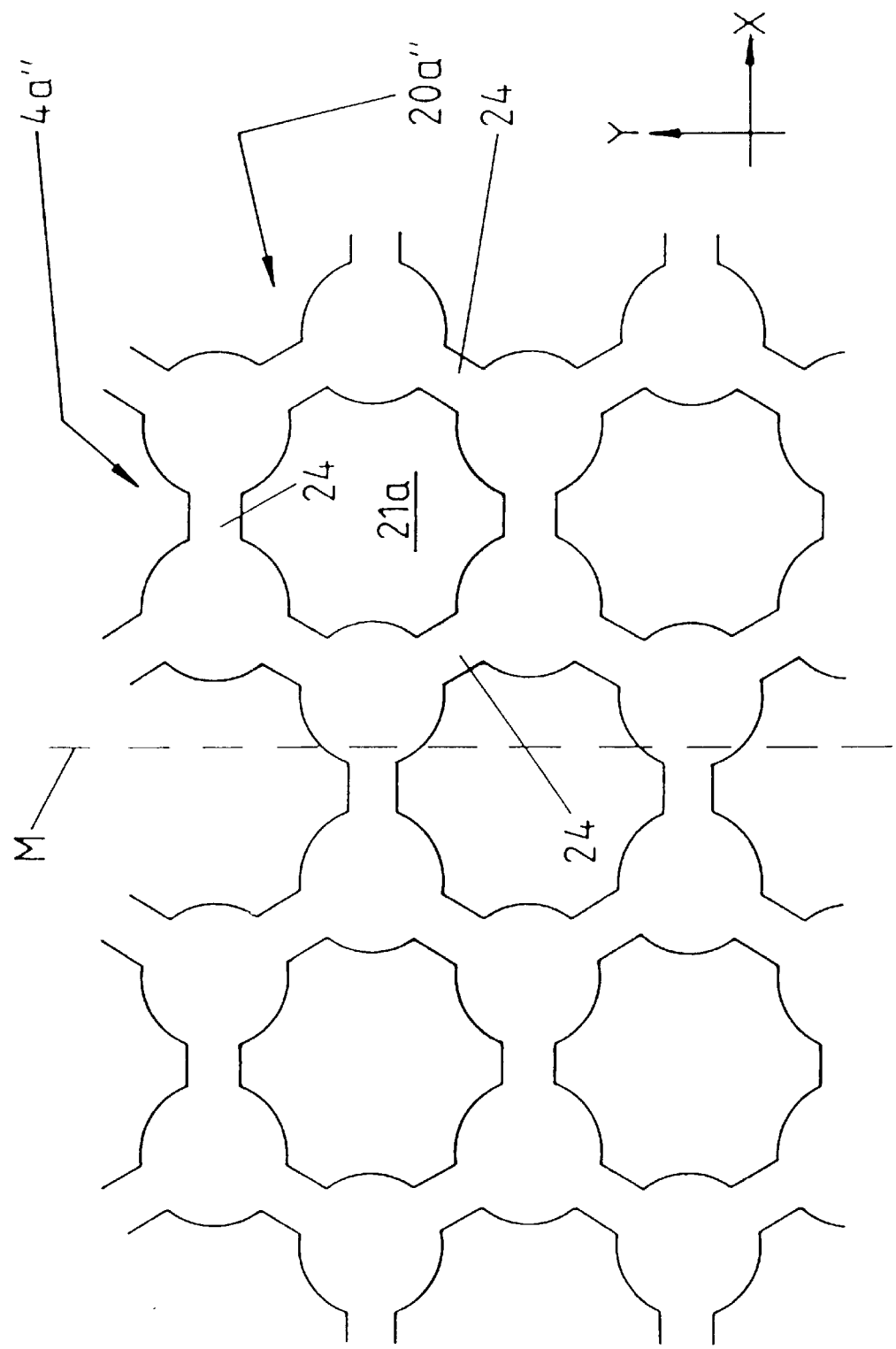

Cooler layer 4a' is described below. It contains a square blank or metal foil, for example, copper foil. Blank 23 forms peripheral sides 6, 7 and 10 and 11 which each adjoin one another at a right angle and of which peripheral sides 6 and 7 and 10 and 11 running parallel to one another are opposite one another. In the corner areas of blank 23 there are a plurality of holes 24''. The center points of holes 24'' form the corner points of an imaginary square which lies with its sides parallel to side 6, 7, 10 and 11. As FIG. 2 shows, cooler layer 4a' with respect to opening 8 and 9, the structuring of area 20 and holes 24'' is made symmetrical to longitudinal axis L which runs parallel to peripheral sides 10 and 11 and perpendicular to peripheral sides 6 and 7 and thus perpendicular to middle axis M. Furthermore, cooler layer 4a' with respect to holes 24'' and with respect to openings 8 and 9 is made symmetrical to middle axis M. Area 20a' consists of a plurality of breaches which are labelled 21a in FIGS. 2–8, and of a plurality of bridge=like material sections 24, which [form] one hexagonal latticework with a plurality of hexagonal ring structures which directly adjoin one another and in which the corner points are each formed by round or circular disk-like partial regions or islands 24 with a width increased compared to bridges 24. Due to the hexagonal ring structures each island 25 forms a node from which a total of three material bridges 24 proceed. Each breach 21a is surrounded by a ring structure. The center points of islands 25 form corner points of adjacent hexagons with the same side length each. Furthermore, the connecting lines between the center points of islands 25 form the longitudinal extension of material bridges 24.

For simpler orientation, in the Figures, two coordinate axes are plotted which run at right angles to one another, specifically the X-axis and Y-axis, of which the X-axis is parallel to longitudinal axis L and thus parallel to peripheral sides 10 and 11 and the Y-axis is parallel to middle axis M and thus parallel to peripheral sides 6 and 7. As is shown especially in FIG. 5, the ring structures formed by bridges 24 and islands 25 are oriented such that two peripheral sides of each hexagon which are arranged parallel to one another, i.e. two material bridges 24 of each hexagon ring structure which run parallel to one another, with their longitudinal extension lie in the X-axis and these two material bridges 24 in the direction of the Y-axis are offset against one another. Other four material bridges 24 of each complete ring structure include an angle of 60 degrees with the X-axis and Y-axis. As the figures also show, islands 25 have a diameter which is less than the diameter of respective breach 21a.

As FIG. 2 shows, area 20a' on openings 8 and 9 each end with incomplete ring structures, on opening 8 each with a half ring structure such that there material bridges 24 with half length stand away from islands 25 in the direction of the X-axis and end at 24'. On opening 9 area 20a' ends with incomplete ring structures such that islands 25 adjoin material sections 24 which extend in the direction of the X-axis and from which each ends in half island 25 at 25'.

As is furthermore shown in FIG. 2, ends 24' end in the area of opening 8 on common line Y1 which runs in the direction of the X-axis. Likewise, ends 25' at opening 9 lie on common line Y2 which runs in the direction of the Y-axis. The distance which line Y1 has in the direction of the X-axis from peripheral side 6 and from the middle point of holes 24'' which are adjacent to this peripheral side is equal to the distance of line Y2 from peripheral side 7 and the center point of holes 24'' adjacent to this peripheral side.

As was detailed above, cooler layer 4a'' turned 180 degrees around middle axis M, i.e. in cooler layer 4a'' on area 20a'' there are ends 25' within opining 8 on line Y1 and ends 24' within opening 9 on line Y2. The described configuration of areas 20a' and 20a'' of cooler layers 4a' and 4a'' result in that in cooler layer 4a'' the hexagonal ring structures are offset in the direction of the X-axis by an amount which is equal to the distance of the middle points of two islands 25 which follow one another in the direction of this axis and which lie on the common X-axis. If at this point cooler layers 4a' and 4a'' are placed on top of one another in an alternating manner, according to FIGS. 4 and 7 it happens that in all layers individual islands 25 are arranged congruently in the direction perpendicular to the planes of this layer and thus form continuous columns 22, while other islands 25 in respective cooler layer 4a' and 4a'' are each opposite one breach 21a of adjacent cooler layer 4a'' or 4a'.

Continuous columns 22 are each provided in a triangular structure, i.e. the intersection points of the axes of these columns 22 with an imaginary plane parallel to layers 4a' or 4a'' each form the corner points of triangles such that several of these intersection points each lie on lines Y3, Y4 . . . Yn which run parallel to the Y-axis and are offset against one another in the direction of the X-axis by the same amount, the intersection points each line being offset in the middle on gaps relative to the intersection points on an adjacent line.

The thickness of cooler layers 4a' and 4a'' is roughly 0.2 to 1.0 mm. The middle or grid distance of material bridges 24, which run in the direction of the X-axis from one another in the direction of the Y-axis, is approximately 1.0 to 10.0 mm. The width of material bridges 24, is roughly 5 to 25% of the aforementioned grid distance. The radius of islands 25 is at most equal to half the distance of the two corner points of the respective hexagon from one another, i.e. the diameter of each island 25 is at most equal to this distance or the side length of the hexagons.

Figure 7:
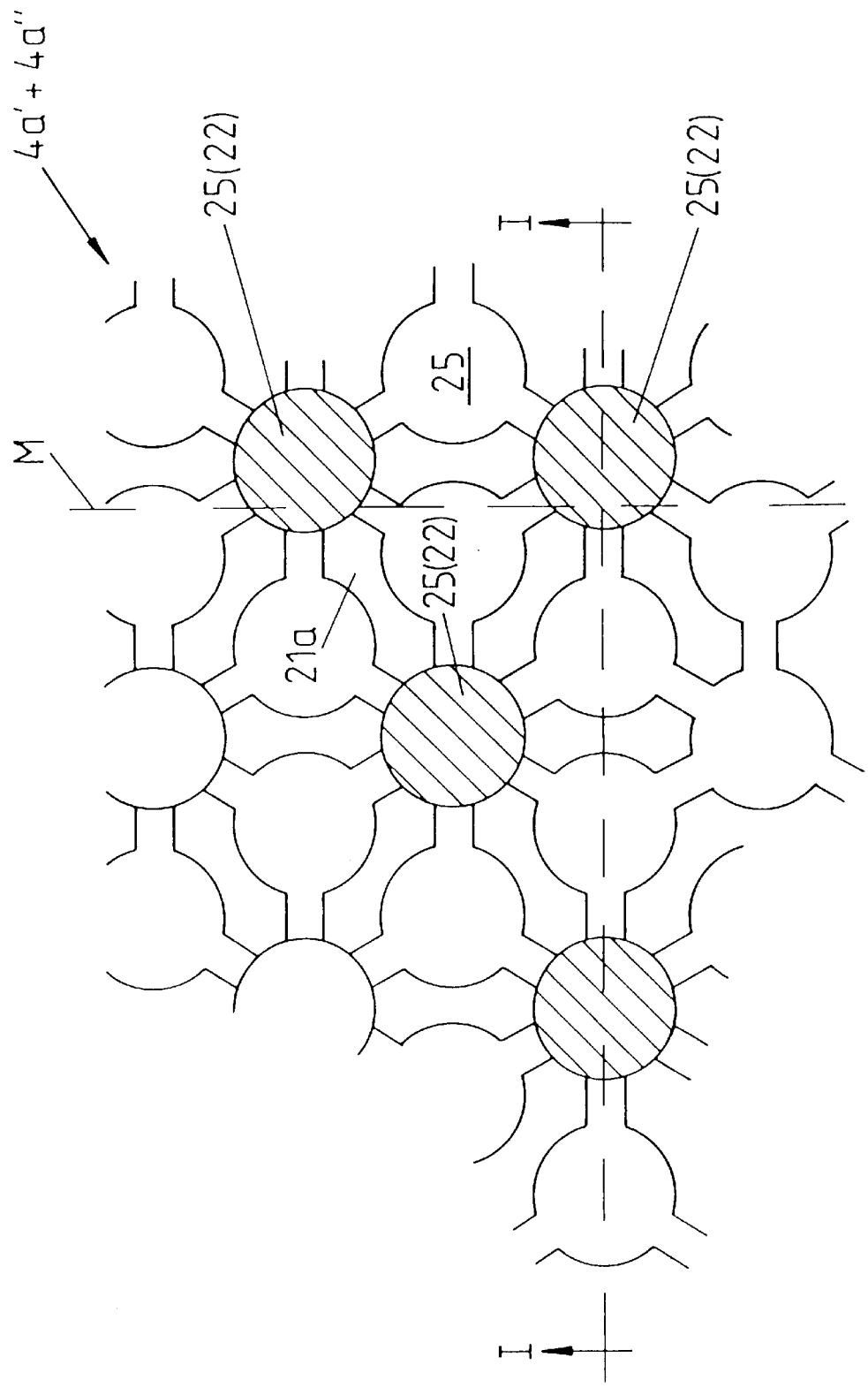
FIG. 7 shows an enlarged detailed view of FIG. 4.
Figure 8:
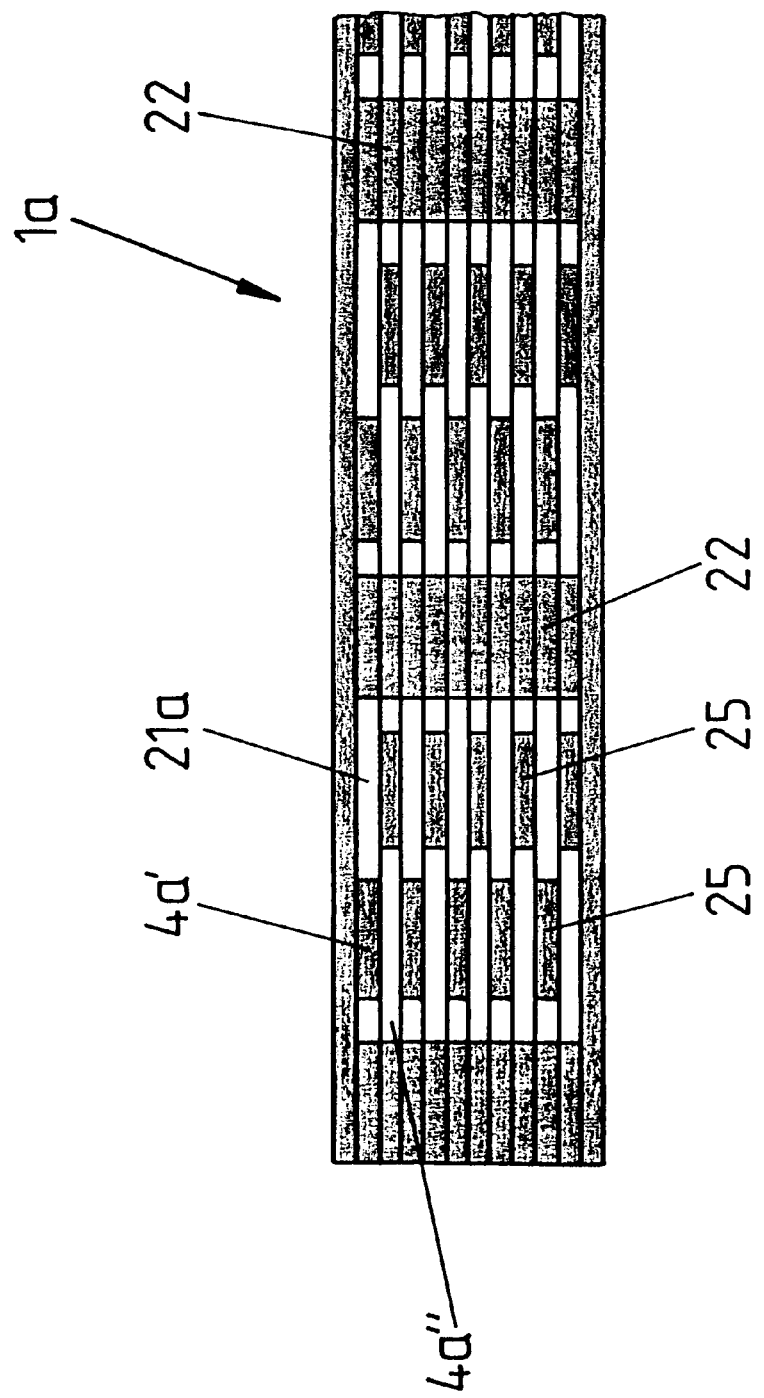
FIG. 8 shows in an enlarged representation a partial section through the microcooler along line I—I of FIG. 7.
Figure 9:
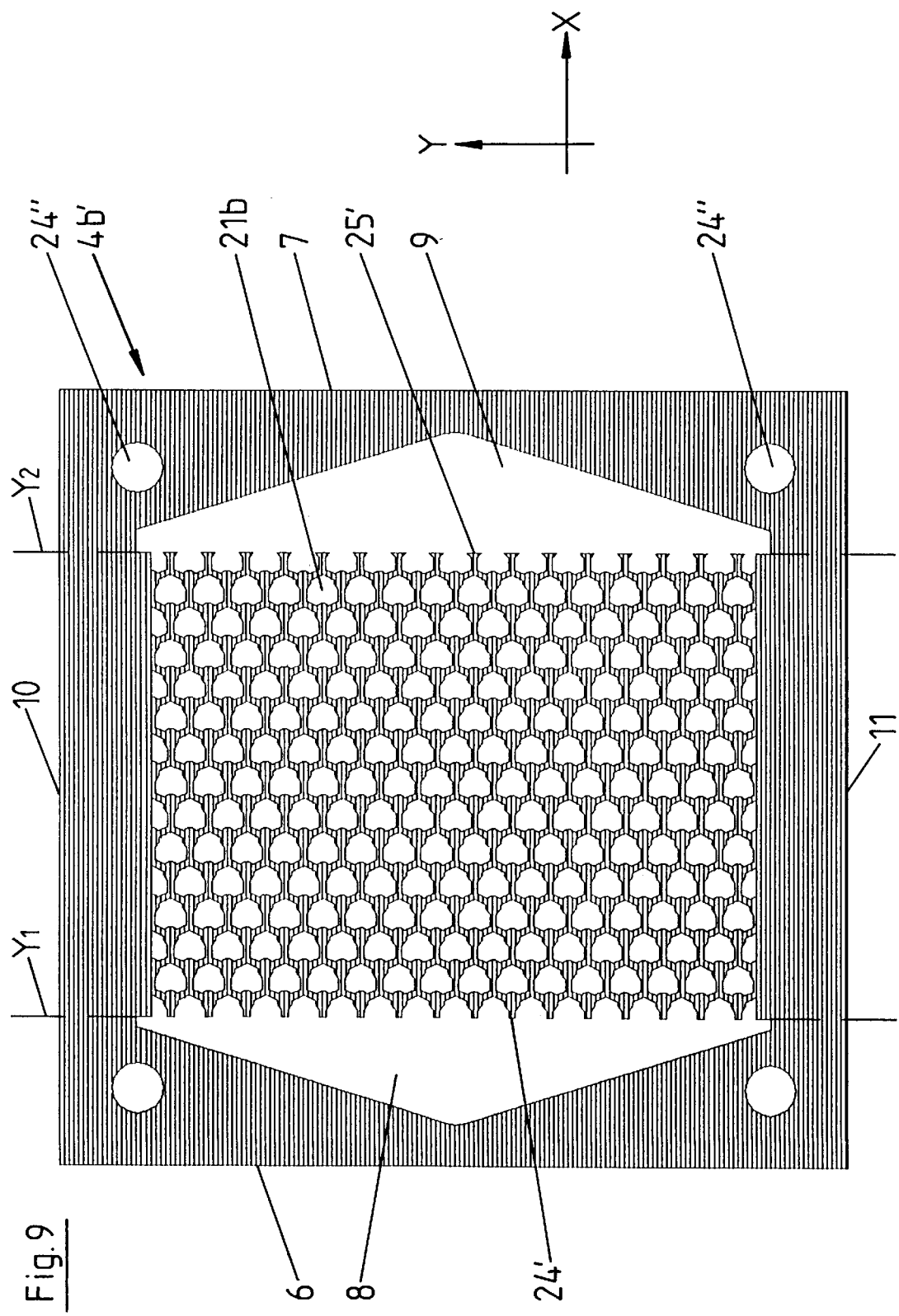
FIGS. 9–11 show similar representations to FIGS. 2–4 in another modified embodiment.
Figure 10:
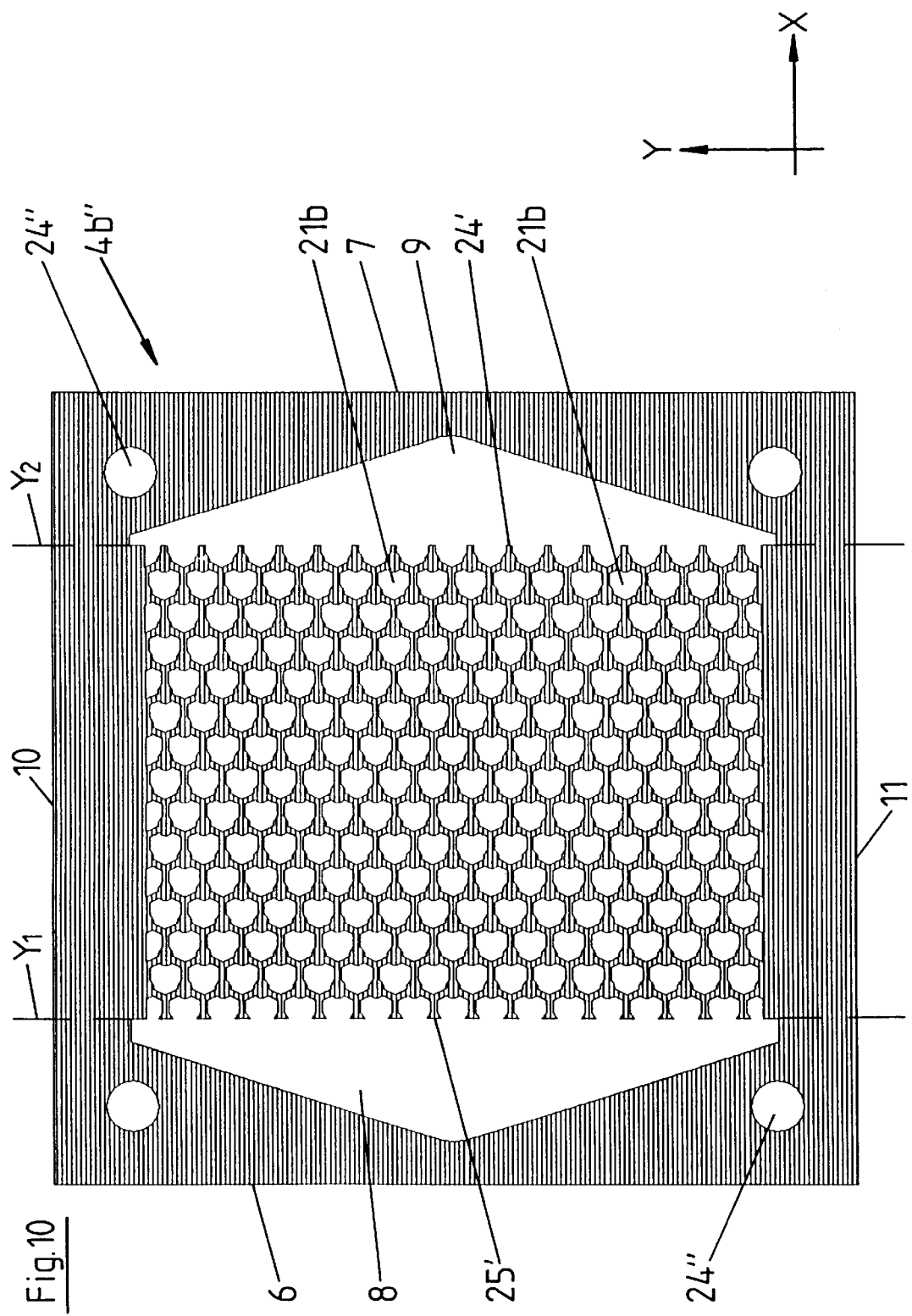
Figure 11:
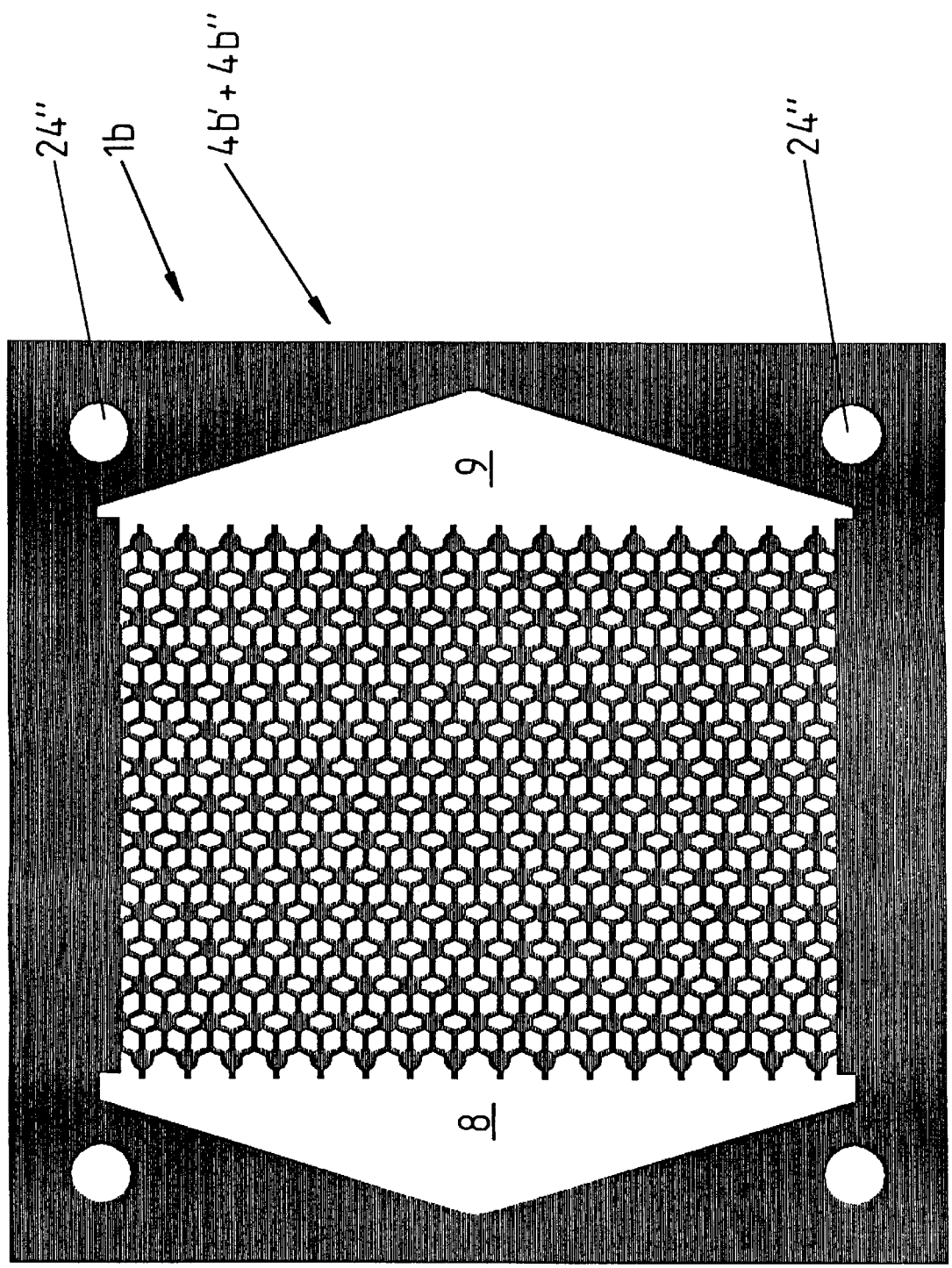
Figure 12:
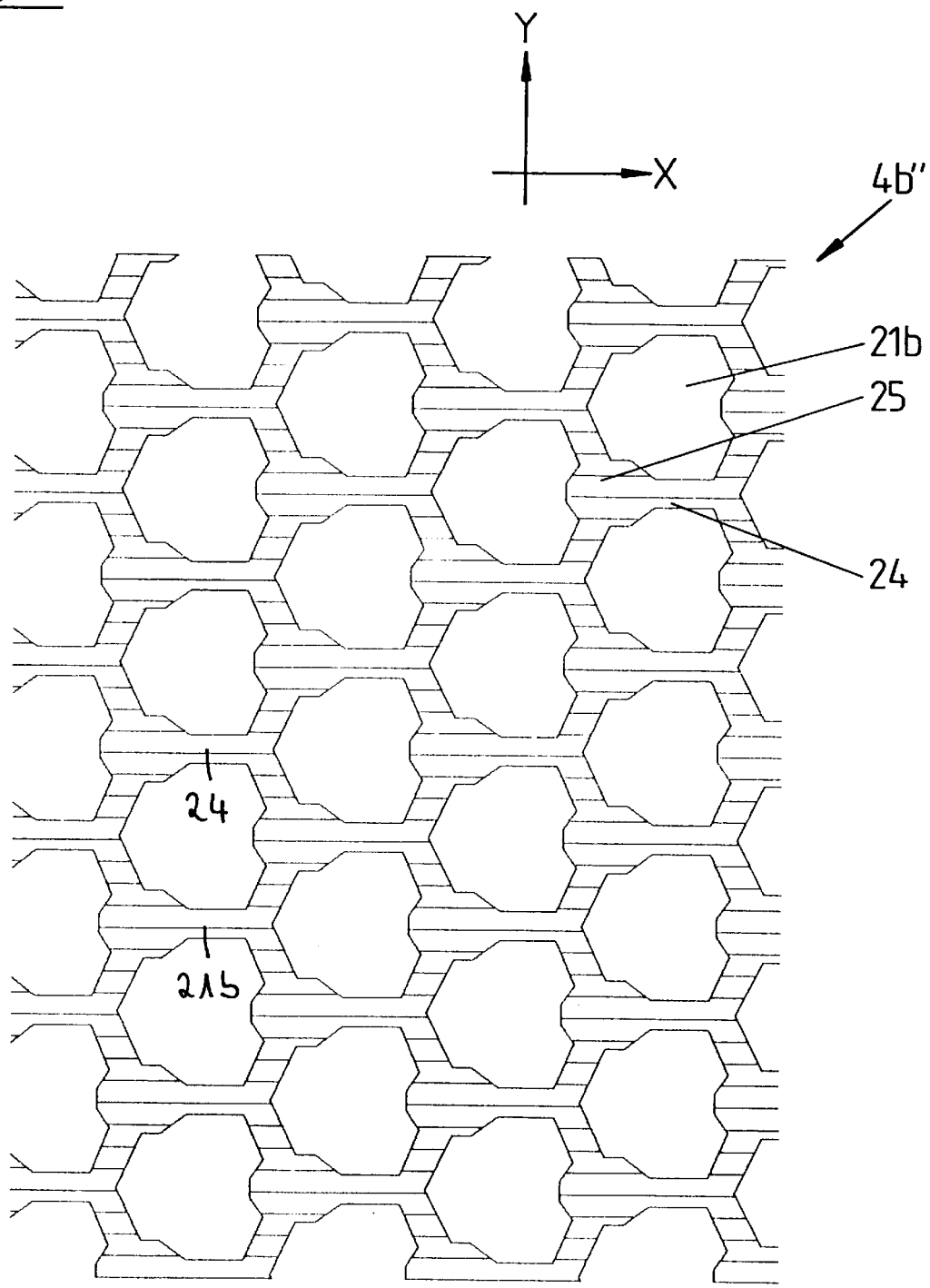
FIGS. 12 and 13 show representations similar to FIGS. 5 and 6 in the embodiments of FIGS. 9–11.
Figure 13:
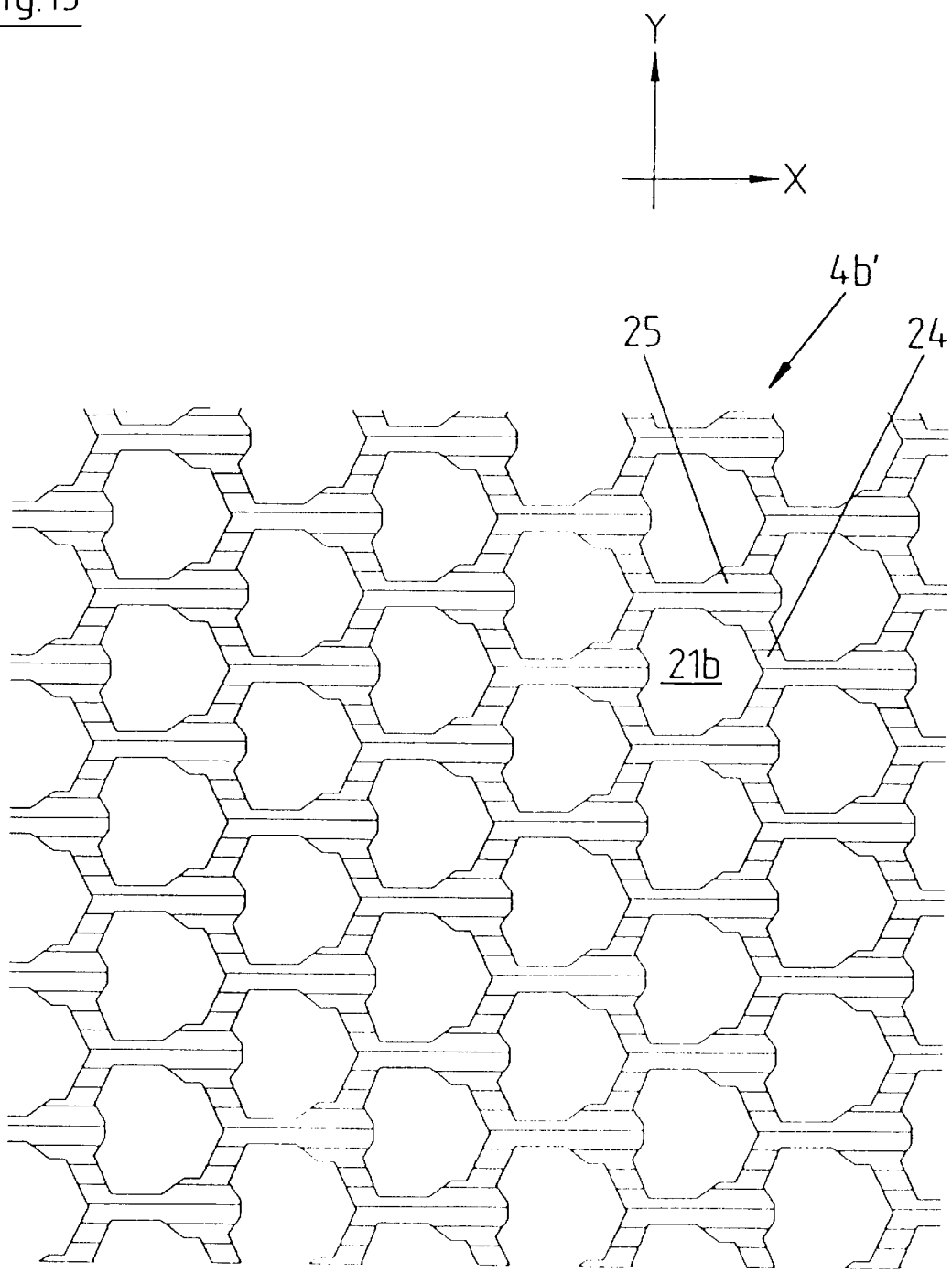

FIG. 8 shows a section along lines I—I of FIG. 7. It is clear from this section that along the intersection line which runs in the direction of X-axis between two columns 22 at a time breaches are formed in cooler layers 4a' and 4a'' such that within these breaches island 25 of one cooler layer is opposite breach 21a of an adjacent cooler layer.

FIGS. 9–13 in similar representations to FIGS. 2–7 show cooler layers 4b' or 4b'' in another possible microcooler 1b of the invention. These cooler layers differ from cooler layers 4a' and 4a'' simply in that areas 20b' and 20b'' are structured such that material bridges 24 in turn form adjacent hexagonal ring structures with breaches 21b. In any case only on three corner points of each equilateral hexagon of each ring structure is the island 25 such that the center points of islands 25 in each ring structure form the corner points of an equilateral triangle, two of these corner points being located on a common line or triangle side which extends in the direction of the Y-axis. For cooler layer 4b' in each ring structure this common side of the equilateral triangle which runs in the direction of the Y-axis is at a greater distance from peripheral side 6 than the triangle vertices which are formed by the middle point of third island 25 and which are opposite this peripheral side.

In cooler layer 4b' ends 24' are in turn located in the area of opening 8 and ends 25' are located in the area of opening 9.

Cooler layer 4b" is made such that its structure essentially corresponds to that of cooler layer 4b' which is turned around middle axis M by 180 degrees.

By alternation of cooler layers 4b' and 4b" on top of one another in the stack which forms microcooler 1b, in turn islands 25 which adjoin on another continuously in all stacks form columns 22 and between these columns the areas through which coolant clan also flow from top to bottom or vice versa and in which material bridges 24 which extend away from columns 22 with branch points which are not formed by islands 25 are located between three material bridges 24 at a time.

In coolers 1a and 1b each breach 21a and 21b in one cooler layer covers two breaches 21a and 21b at a time in an adjacent cooler layer. Furthermore, the cooler layers have their breaches arranged such that the breaches of every other cooler layer are congruent in the axial direction perpendicular to the plane of the cooler layers.

FIGS. 14–20 show another possible embodiment of microcooler 1c and cooler layers 4c' and 4c" which form this microcooler. Cooler layers 4c' and 4c" differ from cooler layers 4a' and 4a" in turn simply by the type of structuring of areas 20c' and 20c", i.e. aside from the configuration detailed below the above statements on cooler layers 4a and 4a " also apply to these cooler layers.

Figure 14:
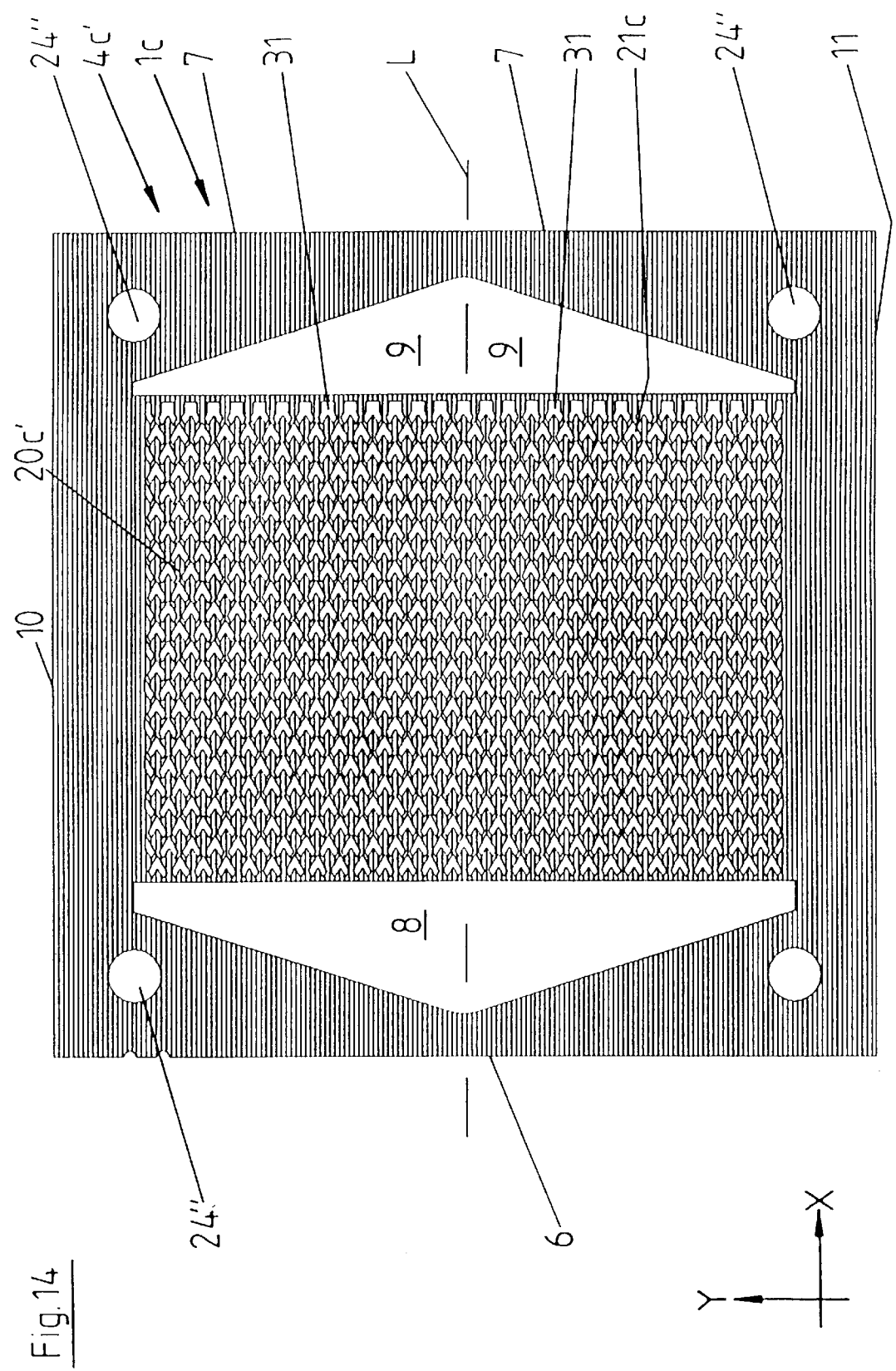
FIGS. 14–16 show similar representations to FIGS. 2–4 in another possible embodiment of the cooler.
Figure 15:
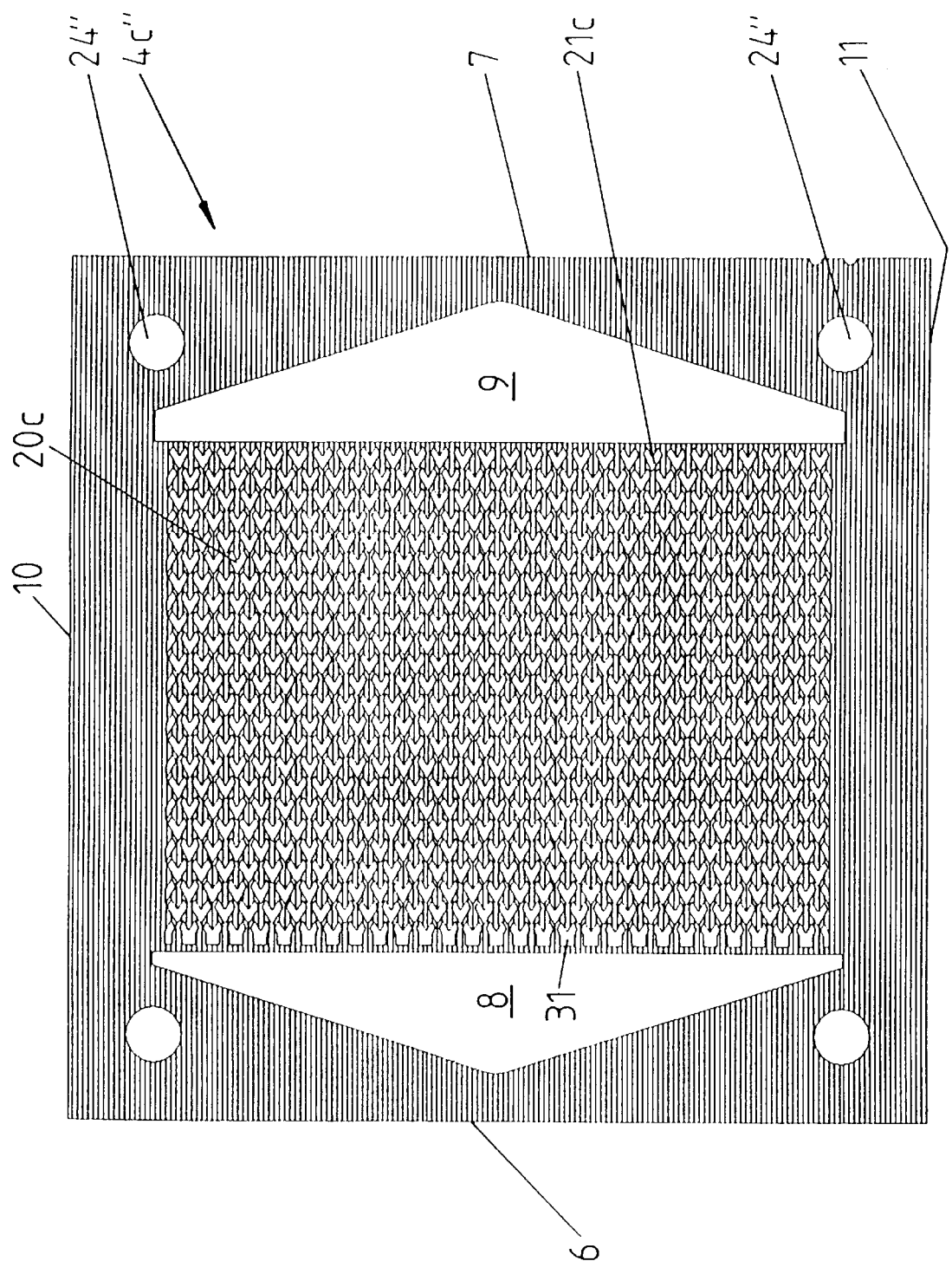
Figure 16:
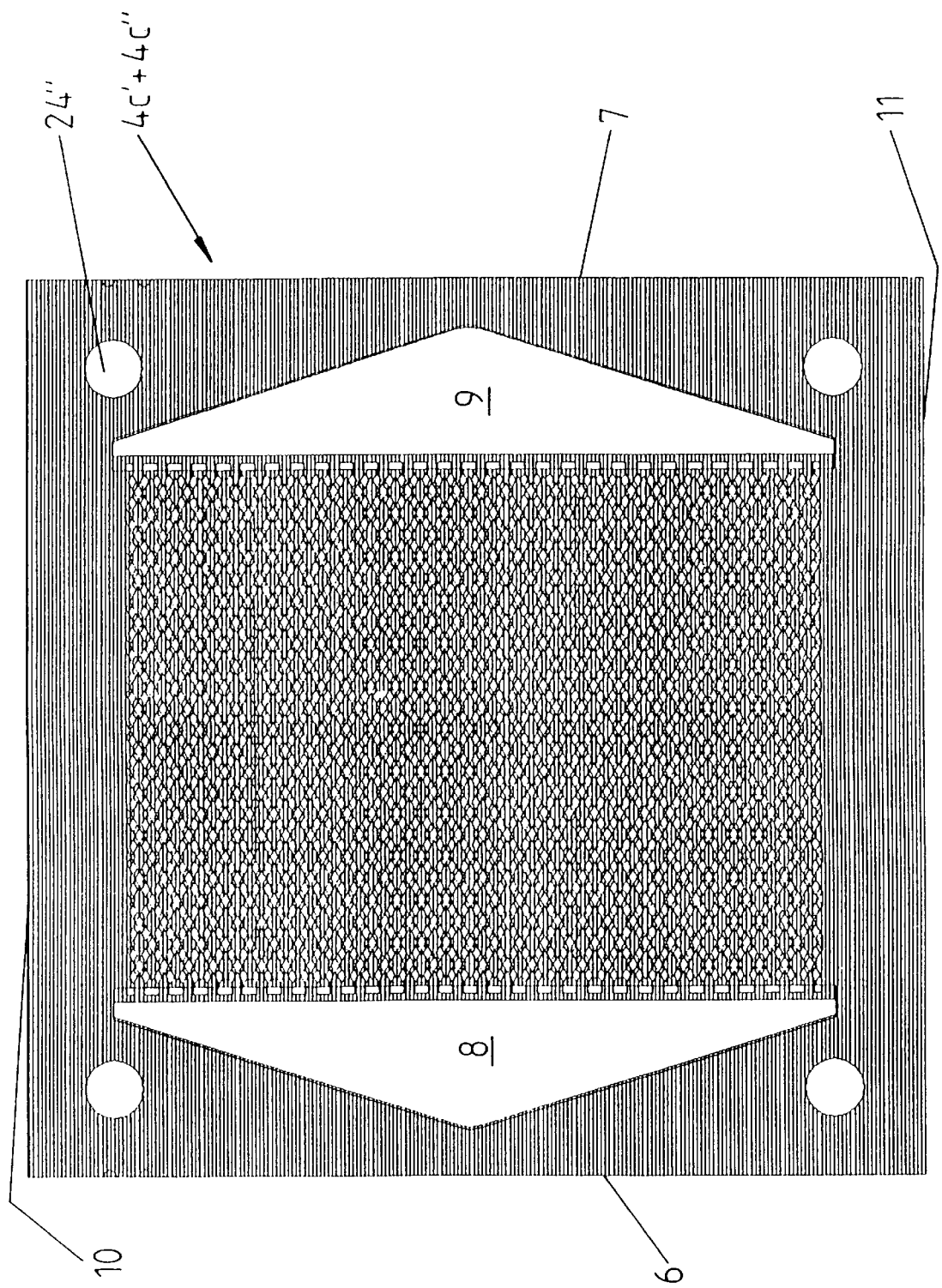

As FIGS. 14 and 17 show in particular, area 20c' of cooler layer 4c', the area having a screen structure, is formed by making a plurality of breaches 21c in the material, of which (breaches) each contain two slots or sections 26 and 27 which pass into one another and which lie with their longitudinal extension on diagonal D26 (section 26) or on diagonal D27 (section 27) which include an angle less than 90 degrees with the X-axis. In the embodiment shown, the X-axis forms the angle bisector of intersecting diagonals D26 and D27 which include an angle less than 90 degrees at their respective intersection point. The intersection angles formed by diagonals D26 and D27 open to peripheral side 6 or opening 8. Furthermore, for all breaches 21c outside side lengths 28 of sections 26 and 27 are the same. Furthermore, a plurality of breaches 21c with their sections 26 each lie on common diagonal D26 and with their sections 27 likewise on common diagonal D27, a plurality of these diagonals D26 being provided parallel and at a distance from one another and a plurality of these diagonals D27 being provided parallel and at a distance from one another such that along each diagonal D26 one breach 21c or its section 26 at a time with interposed material bridge 29 adjoins breach 21c or its section 26. Likewise breaches 21c are arranged such that in the direction of each diagonal D27 each breach 21c or its section 27 via material bridge 30 adjoins another breach 21c or its section 27, etc.

On opening 8 region 20c' has a closed edge adjoined towards middle axis M by a first row of a plurality of breaches 21c, the row extending in the direction of the Y-axis.

On the opening, area 20c' has a closed edge adjoined towards middle axis M by a row of breaches 31 which extends in the direction of the Y-axis, which breaches are made essentially square in the embodiment shown and into which breach 31 breach 21c passes with its angular region formed by the overlapping of sections 26 and 27. The arrangement of breaches 21c' is furthermore such that each diagonal 26 intersects diagonal D27 on longitudinal axis L.

Cooler layer 4c" with respect to the structuring of area 20c" is in turn identical to cooler layer 4c' turned 180 degrees around middle axis M.

Figure 20:
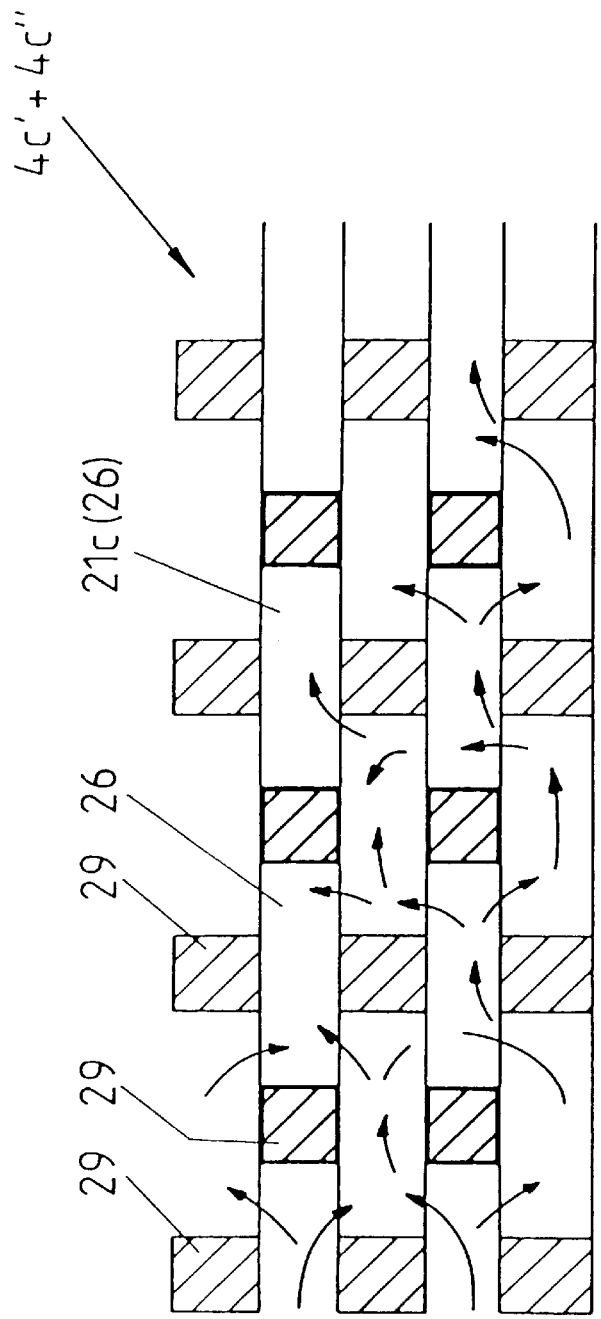
FIG. 20 shows a partial section through the microcooler of FIGS. 14–19 along line II—II of FIG. 19.

The above described formation of two cooler layers 4c' and 4c" results in the fact that in cooler layers 4c' and 4c" which are congruent with their holes 24 and which are stacked in alternation on top of one another each diagonal D26 of one cooler layer 4c lies congruent with diagonal D26 of the adjacent cooler layer and the same applies to diagonal D27, breaches 21c of adjacent cooler layers each overlapping on the ends of sections 26 and 27, in an area which is smaller than side length 28, and cooler layers 41c' and 41c" overlapping continuously with material areas 32 which are each formed between adjacent breaches 21c outside of material bridges 29 and 30 which continuously overlap, and in this way columns 22 are formed. Outside of these continuous columns microcooler 1c has an internal structure which enables flow of coolant through the cooler with continuous alternation of the planes and with intensive follow through the material sections located outside of posts 21, especially also material bridges 29 and 30, as is shown in FIG. 20 with the arrows there which illustrates one section along intersection line II—II, i.e. along diagonal D26. As FIG. 20 also shows, here each breach 21c or section 26 of this breach is opposite material bridge 29 of an adjacent cooler layer, material bridge 29 being located in the middle of opposite section 26. The same picture arises for a section along diagonal D27.

In microcooler 1c thus each breach 21c in one cooler layer covers two breaches 21c in one adjacent cooler layer. Furthermore the cooler layers with their breaches 21c are arranged such that the breaches of every other cooler layer are oriented in the same direction and are congruent in the axial direction perpendicular to the plane of the cooler layers.

Figure 22:
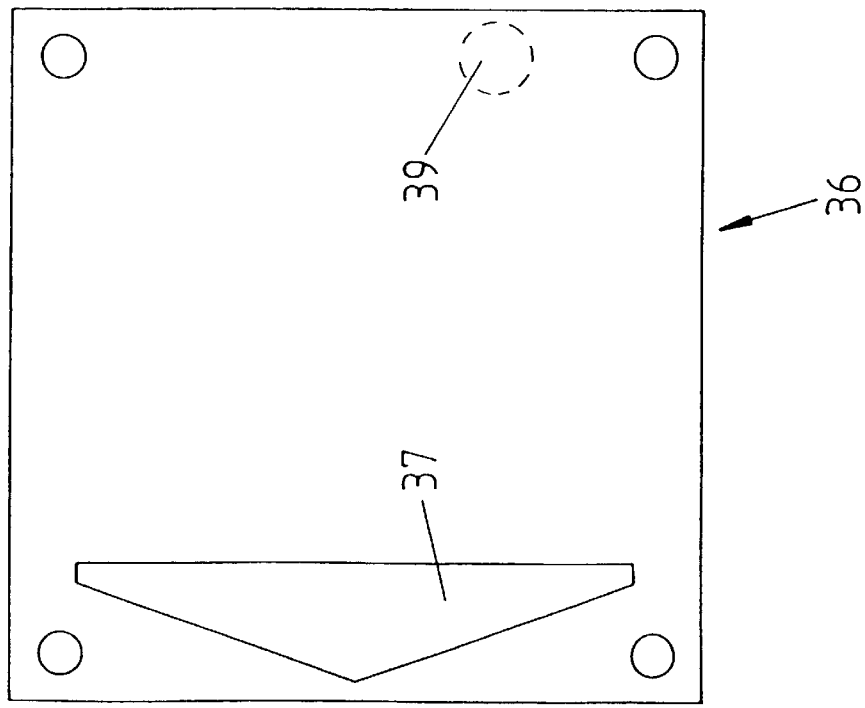
FIG. 22 in a simplified view shows a cut through an intermediate or separating layer which separates the two individual coolers.

FIG. 21 shows as another possible embodiment microcooler 1d which differs from microcooler 1 in that there are two individual coolers 33 and 34, which are each formed according to microcooler 1a, 1b or 1c, on top of one another. Coolant flows through two individual coolers 33 and 34 in counterflow such that the coolant is supplied at inlet 35 of lower cooler 34 and leaves upper microcooler 33 at connection 13 there. To achieve the desired flow through two microcoolers 33 and 34, there is an intermediate or separating layer 36 between these two coolers. Separating layer 36 shown in FIG. 22 is made of a metal sheet or metal foil which has window 37 which establishes a connection which is located between two collection spaces 8' of lower and upper individual cooler 33 and 34 and which however separates collection spaces 9' of this microcooler.

Figure 23:
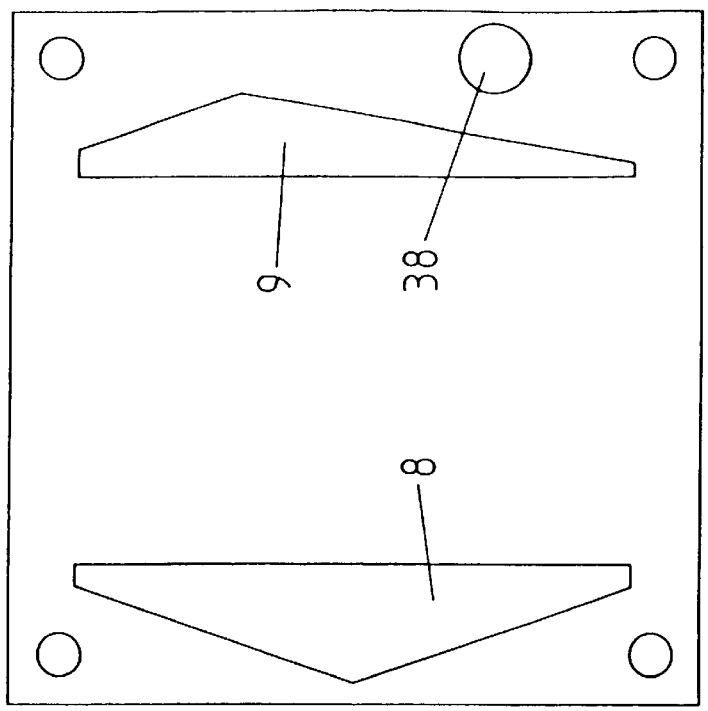
FIG. 23 shows fundamentally the formation of cooler layers for connections routed to one common side of the cooler.

For microcooler 1d, it is also possible to provide connections 13 and 35 on a common side, specifically on the top of cooler 1d. In this case openings 9 of cooler layers 14 which form upper microcooler 33 are made in the manner shown in FIG. 23 such that in addition to opening 9 of each cooler layer there is separate hole 38. When microcooler 1d is mounted these holes 38 of all cooler layers 4 area congruent with one another and congruent with hole 39 which is provided in separating layer 36 and which discharges into collection space 9 of lower cooler 34. Holes 38 and 39 form a channel via which the cooling medium can be supplied on the top of cooler 1d.

Similarly, it is then also possible to supply the coolant for microcooler 1d only on the bottom. In this case, the cooler layers of lower individual cooler 34 are made according to FIG. 23, separating layer 36 in turn having the embodiment shown in FIG. 22.

In the microcooler as described and claimed in the invention the coolant is preferably a liquid medium, for example, water, oil, etc.

Figure 24:
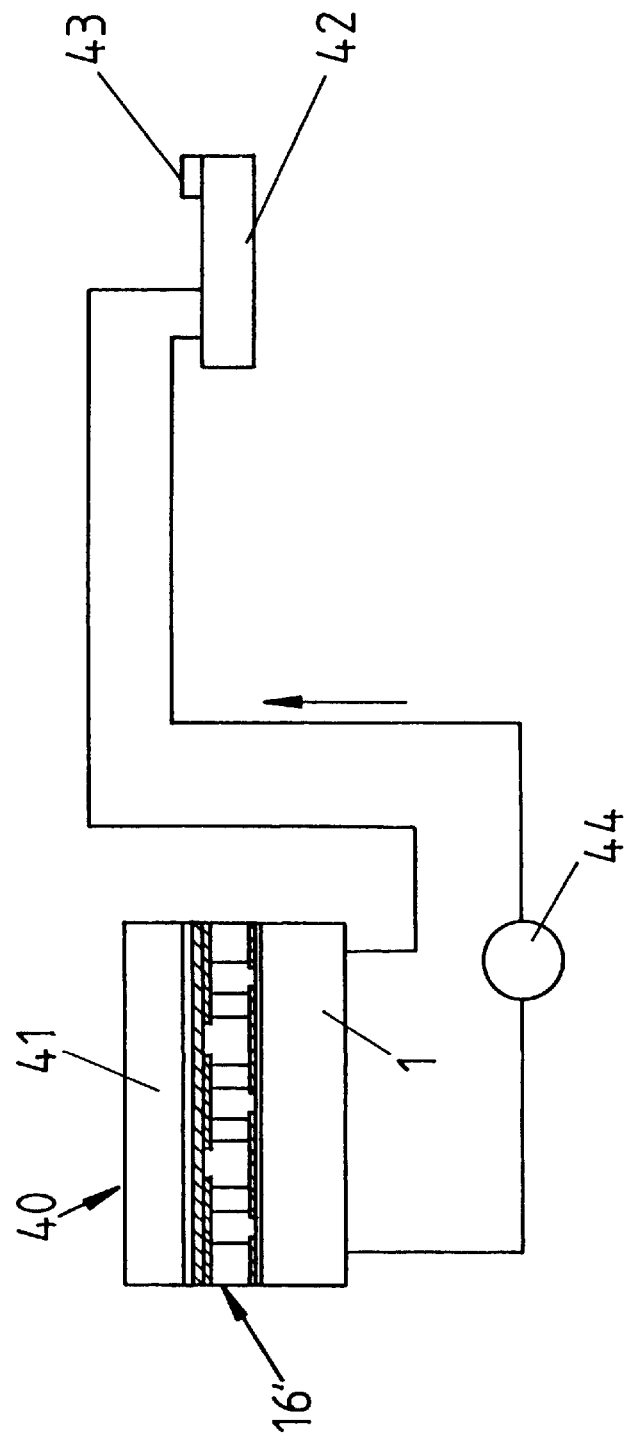
FIG. 24 shows in a simplified representation and in a function diagram a coolant circuit using a cooler arrangement as described in the invention.

Above, in conjunction with FIG. 1, it was assumed that active cooler or heat exchanger arrangement 40 is used for direct cooling of at least one component provided on this cooler arrangement. It is also possible to see cooler arrangement 40 as an active heat exchanger in a coolant circuit as is shown in FIG. 24. In this case on metal coating 19 there is metallic cooling body 41 which can also be produced integrally with this metal coating 19 and which is used for dissipation of thermal energy to the ambient air. In the cooling circuit there is furthermore cooler 42 which is in turn a microcooler according to microcoolers 1–1d, and which is a heat sink which is used for cooling power semiconductor component 43, for example, a diode laser or diode laser arrangement. In the closed cooling circuit there is finally also circulating pump 44 for the coolant.

The coolant circuit shown in FIG. 24 has the advantage that at relatively small dimensions of cooler 42 relatively high cooling for removing the heat loss of semiconductor component 43 is achieved by the coolant flowing through this cooler, the circulating pump and active cooler arrangement 40 in the closed circuit. By controlling the flow through Peltier elements 16, of cooler arrangement 40, the temperature of the coolant and thus the cooling action can be electrically controlled easily, such that for semiconductor component 43, an operating temperature, as constant and/or as low as possible, is achieved.

Figure 25:
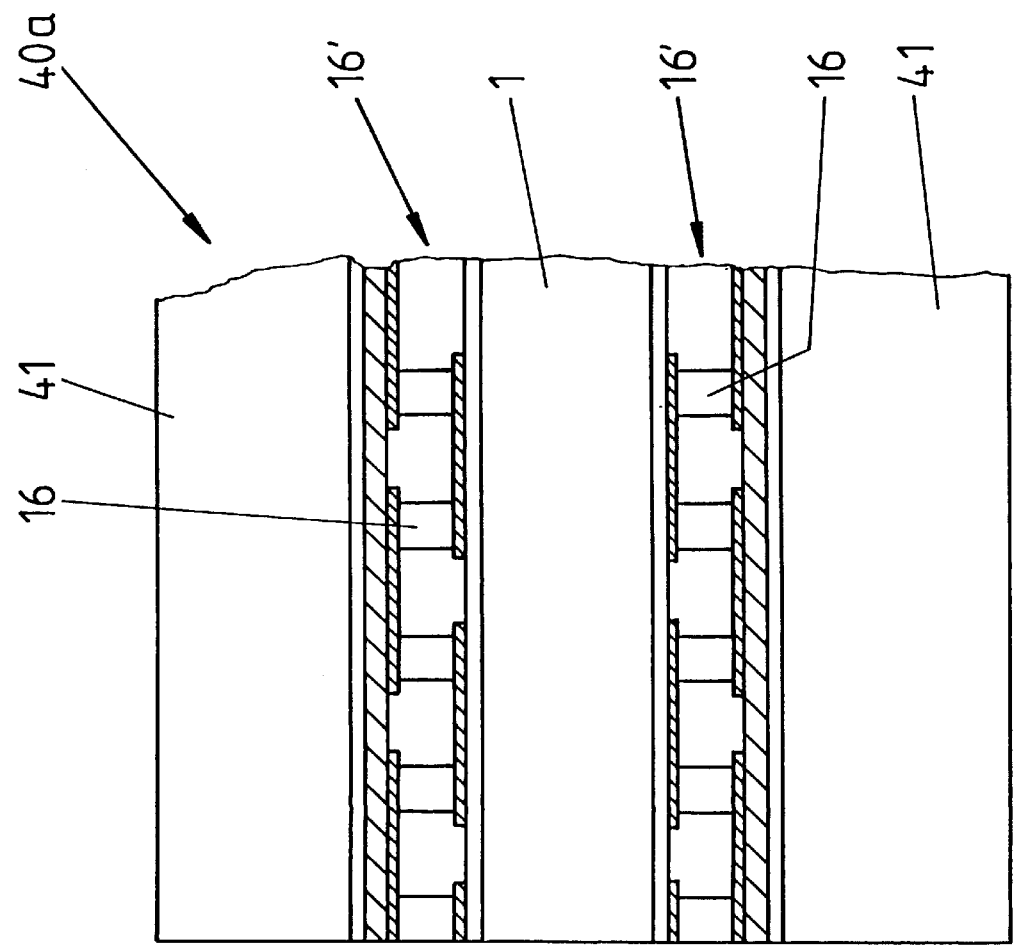
FIGS. 25 and 26 show in a simplified view and side view other possible embodiments of the heat exchanger arrangement as described in the invention.

FIG. 25 shows as another possible embodiment active cooler or heat exchanger arrangement 40a which differs from cooler arrangement 40 in that to both sides of microcooler 1 or also 1a–1d there are attached Peltier arrangement 16' which has formed on the latter, cooling body 41. With cooler arrangement 40a twice the cooling performance can be achieved for the same construction size.

Figure 26:
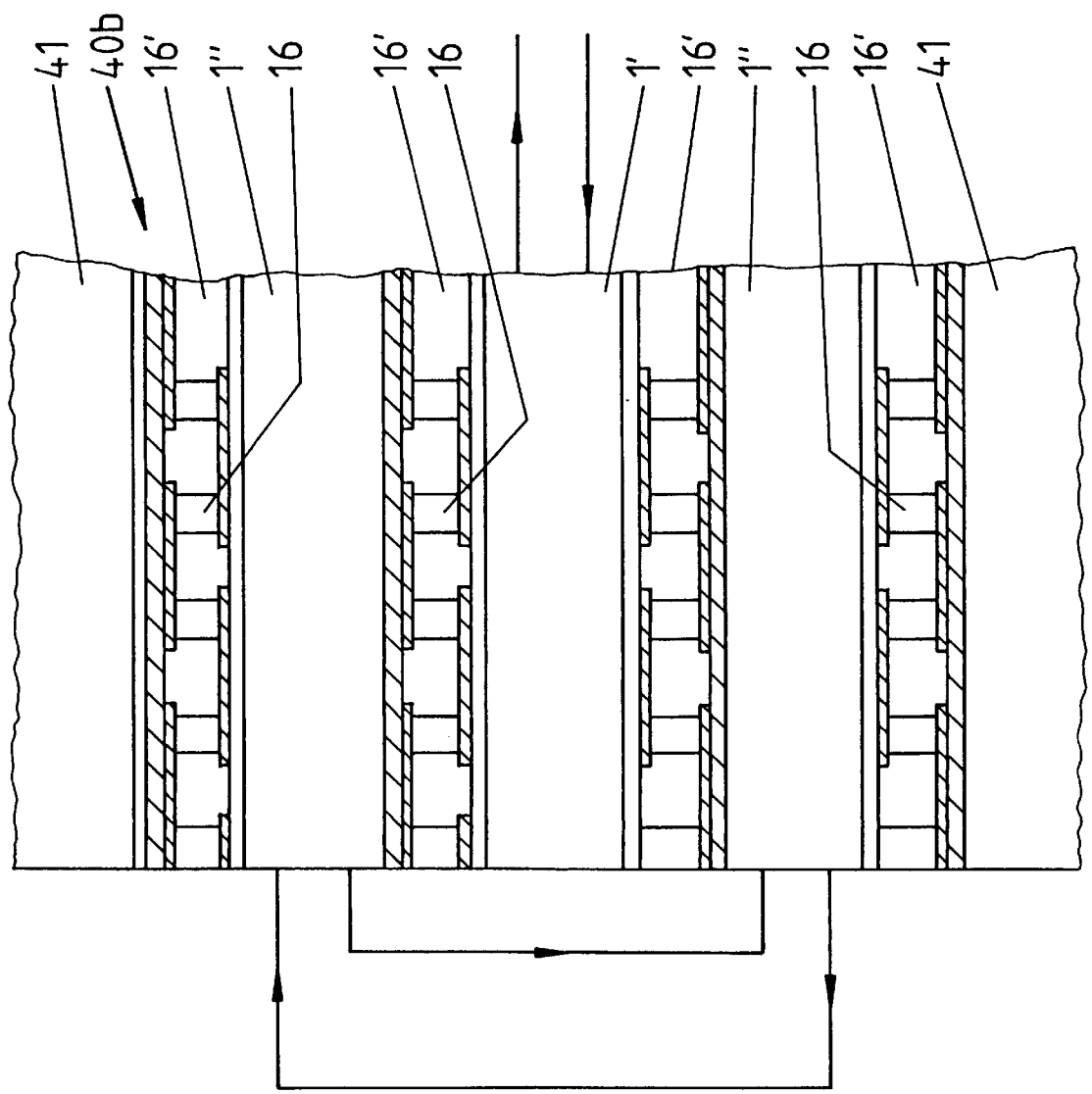

FIG. 26 shows as another possible embodiment cooler arrangement 40b in which there are a total of three microcoolers, specifically the middle microcooler labelled 1' in FIG. 26 for better differentiation, and two outer microcoolers 1". Between middle microcooler 1' and each outer microcooler 1" there is one Peltier arrangement 16' each, these Peltier arrangements being made, oriented and exposed to flow by the Peltier current such that they have their cooling side for example on inner microcooler 1'.

Middle microcooler 1' is for example located in the coolant circuit of FIG. 24 such as was described there for microcooler 1 of cooler arrangement 40. Two outer microcoolers 1" are connected to another outer cooling circuit. It is also possible to connect two outer microcoolers 1" to the cooling circuit of heat sink 42 of semiconductor component 43 and then use middle microcooler 1' to remove heat. In this case Peltier arrangements 16' are operated in turn such that they are adjacent with their cooling side to outer microcooler 1" adjacent at the time.

In the embodiment of the cooler or heat exchanger arrangement shown in FIG. 26, inner microcooler 1' and outer microcoolers 1" are each formed by microcooler 1d in which reversal of the flow direction of the heat-transporting medium takes place. Microcoolers 1' and 1" are operated such that flow through them takes place in counterflow such that a temperature gradient as uniform as possible arises on respective Peltier arrangement 16' between middle microcooler 1' and two outer microcoolers 1".

We claim:

1. An active heat exchanger arrangement, comprising at least one heat exchanger through which at least one heat transporting medium flows;

at least one Peltier element arrangement, which is provided on at least one flat side of said heat exchanger, and said at least one Peltier element arrangement comprises:
at least one first and one second metal coating which are provided on surfaces sides of ceramic layers facing one another and which form a printed circuit, and
a plurality of Peltier elements, said elements having electrical connections joined to said printed circuit formed by said at least one first and said at least one second metal coating;

at least one element for supplying or removing heat, said element is thermally connected to a side of said at least one Peltier element arrangement opposite said at least one heat exchanger;

said at least one heat exchanger comprises:
heat exchanger layers which are joined flat to one another and which are stacked on top of one another and which between themselves form a plurality of channels through which said at least one heat transporting medium flows,
at least one first collection space for supplying said heat transporting medium into the channels,
at least one second collection space for draining said heat transporting medium from the channels,
said at least one first and said at least one second collection space are each formed by a plurality of overlapping openings in said heat exchanger layers, said channels being formed by areas of said heat exchanger layers which lie between said openings forming said at least one first and second collection spaces and are structured in a manner of a screen with a plurality of screen openings closed around their periphery and surrounded by layer material,
wherein said heat exchanger layers are adjoined one to another in a stack,
wherein first layer material sections overlap continuously from heat exchanger layer to heat exchanger layer and thereby form continuous columns and
that each screen opening, of said plurality of screen openings of said heat exchanger layer, is opposite to a further layer material section of an adjoined heat exchanger layer, said further layer material section extending away from one of the continuous columns, so that said at least one transporting medium flow through said screen opening is possible only around or past one of said further layer material sections of an adjacent heat exchanger layer.

2. A cooling system for electrical components, comprising in a closed circuit said at least one heat-transporting medium, at least one cooler for at least one electrical component and said at least one heat exchanger arrangement according to 1.

3. The heat exchanger arrangement as claimed in claim 1, wherein said plurality of openings and said material section adjacent to said plurality of openings form flow paths which continually alternate in planes for said coolant between at least first and second collection spaces.

4. The heat exchanger arrangement as claimed in claim 1, wherein said plurality of openings have cross sectional dimensions which are larger than dimensions of a width of a material section opposite said plurality of openings.

5. The heat exchanger arrangement as claimed in claim 1, wherein said plurality of openings have dimensions which are larger than dimensions or a width of bridges which surround said plurality of openings.

6. The heat exchanger arrangement as claimed in claim 1, wherein said plurality of openings are surrounded by material bridges which pass into one another or which branch in the manner of a network and which form a polygon or ring structure around said plurality of openings.

7. The heat exchanger arrangement as claimed in claim 6, wherein said material bridges form a hexagonal ring structure around said plurality of openings.

8. The heat exchanger arrangement as claimed in claim 7, wherein for said hexagonal ring structure, two opposite polygon sides of each said ring structure which are located parallel to one another are oriented in a first axial direction (X-axis) and wherein for the same structuring of screen-like area of said cooler layers adjacent to one another in said at least one cooler there are structured areas offset by a length of one hexagonal side in said first axial direction (X-axis).

9. The heat exchanger arrangement as claimed in claim 6, wherein at least three corner points of said ring structure form an equilateral triangle, and are enlarged over a surface or are made as islands.

10. The heat exchanger arrangement as claimed in claim 6, wherein all corner points of said polygon or ring structure are enlarged over said surface or are made as islands.

11. An active heat exchanger arrangement, comprising at least one heat exchanger through which at least one heat transporting medium flows;
  at least two Peltier element arrangements which are arranged on at least two opposite flat sides of said at least one heat exchanger and which comprises:
    at least one first and one second metal coating which are provided on surface sides of ceramic layers facing one another and which form a printed circuit, and
    a plurality of Peltier elements, said elements having electrical connections joined to said printed circuits formed by said at least one first and said at least one second metal coatings;
  at least one element for supplying or removing heat which element is thermally connected to a side of said at least one Peltier element arrangement opposite said at least one heat exchanger.

12. A cooling system for electrical components, comprising in a closed circuit said at least one heat-transporting medium, at least one cooler for at least one electrical component and said at least one heat exchanger arrangement according to 11.

13. The active heat exchanger arrangement according to claim 11, said at least one heat exchanger comprising:
  heat exchanger layers which are joined flat to one another and which are stacked on top of one another and which form a plurality of channels through which said heat transporting medium flows,
  at least one first collection space for supplying said heat transporting medium into said plurality of channels,
  at least one second collection space for draining said heat transporting medium from said plurality of channels,
  said at least one first and said at least one second collection space are each formed by a plurality of overlapping openings in said heat exchanger layers,
  said plurality of channels being formed by areas of said heat exchanger layers which lie between said openings forming said at least one first and second collection spaces and are structured in a manner of a screen with a plurality of screen openings closed around their periphery and surrounded by layer material, wherein said heat exchanger layers are adjoined one to another in a stack,
  wherein first layer material sections overlap continuously from heat exchanger layer to heat exchanger layer and thereby form continuous columns and
  that each screen opening of said plurality of screen openings of said heat exchanger layer, is opposite to a further layer material section of an adjoined heat exchanger layer,
  said further layer material section extending away from one of the continuous columns, so that said at least one transporting medium flow through said screen opening is possible only around or past one of said further layer material sections of an adjacent heat exchanger layer.

14. The heat exchanger arrangement as claimed in claim 11, wherein said at least one cooler comprises cooler layers which are joined flat to one another, which are stacked on to of one another and which between themselves form cooling channels through which a coolant flows and which discharge into at least one first collection space for supplying the coolant and into at least one or second collection space for draining coolant, said at least one first and said at least one second collection space are formed by openings in said cooler layers and said cooling channels are formed by structuring at least one area of said cooler layers which lies between said openings with a plurality of breaches, that said at least one area which lies between said openings in said cooler layers is structured in a manner of a screen with said plurality of breaches closed around their periphery such that for said cooler layers which are stacked on to of one another in said cooler first, material sections of material of the areas structured in the manner of a screen, said material remaining around said plurality of breaches, overlap continuously from said cooler layer to said cooler layer and form one continuous column at a time and opposite said plurality of breaches of said cooler layers there is another material section which extends away from said continuous column such that past this material section the flow medium flows through said plurality of breaches.

15. The heat exchanger arrangement as claimed in claim 14, wherein said continuous column is formed by corner points of a ring structure.

16. An active heat exchanger arrangement, comprising at least one heat exchanger through which at least one heat transporting medium flows;
  at least one Peltier element arrangement which is arranged on at least one flat side of said heat exchanger and which comprises:
    at least one first and one second metal coating which are provided on surface sides of ceramic layers facing one another and which form a printed circuit, and
    a plurality of Peltier elements, said elements having electrical connections joined to said printed circuits formed by said at least one first and said at least one second metal coatings;
  at least one element for supplying or removing heat which element is thermally connected to a side of said at least one Peltier element arrangement opposite said at least one heat exchanger;
  said heat exchanger comprising at least two individual coolers which are joined in cascade into said heat exchanger.

17. An active heat exchanger arrangement according to claim 16, further comprising a separating layer between said at least two individual coolers.

18. An active heat exchanger arrangement according to claim 16, further comprising heat exchanger layers which are joined flat to one another and which are stacked on top one another and which between themselves form a plurality of channels through which said heat transporting medium flows, at least one first collection space for supplying said heat transporting medium into the channels, at least one second collection space for draining said heat transporting medium from the channels, said at least one first and said at least one second collection space are each formed by a plurality of overlapping openings in said heat exchanger layers, said channels being formed by areas of said heat exchanger layers which lie between said openings forming said at least one first and second collection spaces and are structured in a manner of a screen with a plurality of screen openings closed around their periphery and surrounded by layer material, wherein said heat exchanger layers are adjoined one to another in a stack, wherein first layer material sections overlap continuously from heat exchanger layer and thereby form continuous columns and that each screen opening of said plurality of screen openings of said heat exchanger layer is opposite to a further layer material section of an adjoined heat exchanger layer, said further layer material section extending away from one of the continuous columns, so that said at least one transporting medium flow through said screen opening is possible only around or past one of said further layer material sections of an adjacent heat exchanger layer.

19. A cooling system for electrical components, comprising in a closed circuit said at least one heat-transporting medium, at least one cooler for at least one electrical component and said at least one heat exchanger arrangement according to 16.

20. The active heat exchanger arrangement according to claim 16, said at least one heat exchanger comprising:

heat exchanger layers which are joined flat to one another and which are stacked on top of one another and which form a plurality of channels through which said heat transporting medium flows, at least one first collection space for supplying said heat transporting medium into said plurality of channels, at least one second collection space for draining said heat transporting medium from said plurality of channels, said at least one first and said at least one second collection space are each formed by a plurality of overlapping openings in said heat exchanger layers, said plurality of channels being formed by areas of said heat exchanger layers which lie between said openings forming said at least one first and second collection spaces and are structured in a manner of a screen with a plurality of screen openings closed around their periphery and surrounded by layer material, wherein said heat exchanger layers are adjoined one to another in a stack, wherein first layer material sections overlap continuously from heat exchanger layer to heat exchanger layer and thereby form continuous columns and that each screen opening of said plurality of screen openings of said heat exchanger layer, is opposite to a further layer material section of an adjoined heat exchanger layer, said further layer material section extending away from one of the continuous columns, so that said at least one transporting medium flow through said screen opening is possible only around or past one of said further layer material sections of an adjacent heat exchanger layer.

21. The heat exchanger arrangement as claimed in claim 16, wherein said at least one element for supplying and/or removing heat is a metal surface for holding at least one electrical component.

22. The heat exchanger arrangement as claimed in claim 16, wherein said at least one element for supplying and/or removing heat is a passive cooling body.

23. The heat exchanger arrangement as claimed in claim 16, wherein said at least one element for supplying and/or removing heat is a cooler through which a heat-transporting medium flows.

24. The heat exchanger arrangement as claimed in claim 16, wherein on said at least one cooler through which at least one heat-transporting medium flows, on two opposite sides there is said at least one Peltier element arrangement connected by a side facing away from said cooler to said at least one element for supplying and/or removing heat.

25. The heat exchanger arrangement as claimed in claim 16, wherein a connection between said at least one Peltier element arrangement and said cooler through which said at least one heat-transporting medium flows and to another element for supplying and/or removing heat, is established using direct copper binding.

26. The heat exchanger arrangement as claimed in claim 16, wherein said at least one cooler comprises cooler layers which are joined flat to one another, which are stacked on to of one another and which between themselves form cooling channels through which a coolant flows and which discharge into at least one first collection space for supplying the coolant and into at least one or second collection space for draining coolant, said at least one first and said at least one second collection space are formed by openings in said cooler layers and said cooling channels are formed by structuring at least one area of said cooler layers which lies between said openings with a plurality of breaches, that said at least one area which lies between said openings in said cooler layers is structured in a manner of a screen with said plurality of breaches closed around their periphery such that for said cooler layers which are stacked on to of one another in said cooler first, material sections of material of the areas structured in the manner of a screen, said material remaining around said plurality of breaches, overlap continuously from said cooler layer to said cooler layer and form one continuous column at a time and opposite said plurality of breaches of said cooler layers there is another material section which extends away from said continuous column such that past this material section the flow medium flows through said plurality of breaches.

27. The heat exchanger arrangement as claimed in claim 16, wherein said cooler layers are made identical and each said cooler layer is adjoined to another turned or rotated cooler layer.

28. The heat exchanger arrangement as claimed in claim 16, wherein a structured area of each said cooler layer has a plurality of openings which are formed by two crossing or intersection opening sections, and wherein cooler layers are adjoined to one another such that said plurality of openings of said adjoined cooler layers each overlap only in a partial area, material sections or bridges formed between said plurality of adjoined openings of one cooler layer are opposite one opening of said adjoined cooler layer and material sections remaining between said plurality of openings form continuous columns.

29. The heat exchanger arrangement as claimed in claim 28, wherein each said open has a first opening section and a second opening section which passes into the latter or which intersects it, and wherein there are first opening sections of said plurality of openings each following one another on a common first axis line or diagonal and separated from one another by first material bridges, and that there are second opening sections of said plurality of openings each following one another on a common second axis line or diagonal and separated from one another by second material bridges.

30. The heat exchanger arrangement as claimed in claim 29, wherein said first diagonal and said second diagonal intersect at an angle less than or equal to 90 degrees.

31. The heat exchanger arrangement as claimed in claim 29, wherein said plurality of openings and said first and second diagonals include an angle which opens to opposite sides for said adjoined cooler layers.

32. The heat exchanger arrangement as claimed in claim 28, wherein said plurality of openings of said adjacent cooler layers each overlap on the end areas of said opening sections which are at a distance from that area on which said sections pass into one another or intersect one another.

33. The heat exchanger arrangement as claimed in claim 16, wherein said plurality of opening are each made angular.

34. The heat exchanger arrangement as claimed in claim 16, wherein said cooler layer is metal or metal foil.

35. The heat exchanger arrangement as claimed in claim 16, wherein on its top and/or its bottom it is provided with at least one ceramic layer.

36. The heat exchanger arrangement as claimed in claim 35, wherein said ceramic layer is provided with a metal coating which forms printed circuits, contact surfaces, or attachment surfaces.

37. The heat exchanger arrangement as claimed in claim 16, wherein on at least one side of said cooler layer there is at least one electrical components.

38. The heat exchanger arrangement as claimed in claim 16, wherein said cooler layers are joined to one another using direct copper bonding or diffusion bonding.

39. The heat exchanger arrangement as claimed in claim 16, wherein at least two individual coolers are joined in a cascade into an overall cooler.

40. The heat exchanger arrangement as claimed in claim 39, wherein there is a separating layer between said at least two individual coolers.

41. The heat exchanger arrangement as claimed in claim 16, wherein a liquid medium selected from the group consisting of water and oil is used as said cooling medium.

42. The heat exchanger arrangement as claimed in claim 16 is an evaporation cooler.

43. The heat exchanger arrangement as claimed in claim 16, wherein each opening in one cooler layer at least partially overlaps at least two openings in one adjoining cooling layer.

44. The heat exchanger arrangement as claimed in claim 16, wherein said plurality of openings of every other cooler layer are arranged congruently with one another.

45. The heat exchanger arrangement as claimed in claim 16, wherein said at least one cooler through which said heat-transporting medium flows is a component of a closed coolant circuit which is used to cool at least one heat sink of a semiconductor component.

46. The heat exchanger arrangement as claimed in claim 16, wherein by changing an electrical current setting of said Peltier elements, control of removal or supply of heat by said cooler arrangement takes place.

* * * * *